(12) United States Patent
Muemmler et al.

(10) Patent No.: US 7,482,221 B2
(45) Date of Patent: Jan. 27, 2009

(54) MEMORY DEVICE AND METHOD OF MANUFACTURING A MEMORY DEVICE

(75) Inventors: Klaus Muemmler, Dresden (DE); Stefan Tegen, Dresden (DE); Peter Baars, Dresden (DE); Joern Regul, Dresden (DE)

(73) Assignee: Infineon Technologies AG, Munich (DE)

( * ) Notice: Subject to any disclaimer, the term of this patent is extended or adjusted under 35 U.S.C. 154(b) by 310 days.

(21) Appl. No.: 11/203,927

(22) Filed: Aug. 15, 2005

(65) Prior Publication Data

US 2007/0037334 A1 Feb. 15, 2007

(51) Int. Cl.
*H01L 21/8242* (2006.01)
(52) U.S. Cl. ............... 438/241; 438/253; 438/255; 438/256
(58) Field of Classification Search ........... 438/241, 438/253, 254, 255, 256
See application file for complete search history.

(56) References Cited

U.S. PATENT DOCUMENTS

| | | | | |
|---|---|---|---|---|
| 5,386,382 A | * | 1/1995 | Ahn | 365/174 |
| 5,895,239 A | | 4/1999 | Jeng et al. | |
| 6,215,144 B1 | * | 4/2001 | Saito et al. | 257/310 |
| 6,790,725 B2 | * | 9/2004 | Coursey | 438/253 |

* cited by examiner

*Primary Examiner*—Michael Trinh
(74) *Attorney, Agent, or Firm*—Dicke, Billig & Czaja, PLLC

(57) ABSTRACT

The invention relates to a method of forming a memory device comprising a memory cell array and a peripheral portion. When forming the capacitors in the memory cell array, a sacrificial layer is deposited which is usually made of silicon dioxide and which is used for defining the storage electrode above the substrate surface. The sacrificial layer is removed selectively from the array portion while being maintained in the peripheral portion. This is achieved by providing an array separation trench which acts as a lateral etch stop.

8 Claims, 28 Drawing Sheets

MEMORY DEVICE AND METHOD OF MANUFACTURING A MEMORY DEVICE

BACKGROUND

The invention relates to a memory device having an array of memory cells such as DRAM (Dynamic Random Access Memory) cells, as well as to a method of manufacturing such a memory device.

Memory cells of a dynamic random access memory (DRAM) generally include a storage capacitor for storing an electrical charge that represents an information to be stored and an access transistor which is connected with a storage capacitor. The access transistor includes a first and a second source/drain region, a channel connecting the first and the second source/drain region as well as a gate electrode controlling an electrical current flow between the first and the second source/drain region. The transistor usually is at least partially formed in the semiconductor substrate. The gate electrode forms part of the word line and is electrically insulated from the channel by a gate dielectric. By addressing the access transistor via a corresponding word line, the information stored in the storage capacitor is read out to a corresponding bit line.

In the currently used DRAM memory cells, the storage capacitor can be implemented as a trench capacitor in which the two capacitor electrodes are disposed in a trench that extends in the substrate in a direction perpendicular to the substrate surface.

In one implementation of the DRAM memory cell, the electrical charge is stored in a stacked capacitor, which is formed above the surface of the substrate.

FIG. 28 illustrates an exemplary plan view of a memory device, having a memory cell array II and a peripheral portion I. A boundary region III is formed between the memory cell array II and the peripheral portion I. The memory cell array II includes a plurality of memory cells 330, each of the memory cells have a storage capacitor 24 and an access transistor 30. The storage capacitor includes a first and a second capacitor electrode 17, 19, the first capacitor electrode 17 being connected with a first source/drain region 31 of the access transistor. The channel 33 is formed between the first and the second source/drain region 31, 32 and a gate electrode 34 controls the conductivity of the channel 33. The gate electrode 34 is insulated from the channel 33 by a gate insulating layer 35. By addressing the address transistor 30 via the corresponding word line 310, the information stored in the storage capacitor is read out to a corresponding bit line 320. The layout illustrated in FIG. 28 corresponds to the so-called folded bit line layout. However, as is to be clearly understood, the present invention is applicable to any kind of memory cell array layouts.

The support portion I refers to a portion at the edge of the memory cell array in which support circuits such as decoders, sense amplifiers 340 and word line drivers 350 for activating a word line 310 are located. Generally, the peripheral portion of a memory device includes circuitry for addressing memory cells and for sensing and processing the signals received from the individual memory cells. Usually, the peripheral portion is formed in the same semiconductor substrate as the individual memory cells. In addition, the boundary region is as well formed in the same semiconductor substrate. Hence, it is highly desirable to have a manufacturing process by which the components of the memory cell array and the peripheral portion can be formed simultaneously.

In particular, if the storage capacitor of the memory cell is implemented as a stacked capacitor extending above the semiconductor substrate surface, a problem arises that the whole substrate surface is covered by a thick sacrificial layer which is removed during the processing of the stacked capacitor. After completion of the capacitor, a second deposition step of a dielectric layer has to be made in order to provide an insulation for the following metal layer.

A further problem arises, that during the processing of the peripheral portion a contact for contacting the peripheral portion has to be formed by etching a contact hole through a thick layer (3 μm) of an insulating material.

U.S. Pat. No. 5,895,239 discloses a method of forming a memory device in which bit lines in the array portion are formed simultaneously with landing plugs in the peripheral portion. In particular, according to this patent, the landing plugs are formed at a level of the first wiring layer.

SUMMARY

According to one embodiment of the present invention, a method of forming a memory device includes providing a semiconductor substrate having a surface and providing an array portion having an array of access transistors, each of said access transistors having a first and a second source/drain region. A channel is disposed between said first and second source/drain region and a gate electrode which is electrically insulated from said channel and adapted to control the conductivity of said channel, each of said access transistors being at least partially formed in said semiconductor substrate. The method also includes providing a peripheral portion including peripheral circuitry, said peripheral portion being at least partially formed in said semiconductor substrate. A substrate portion between said peripheral portion and said array of access transistors defines a boundary region. The method includes providing a plurality of array contact pads connected with said first source/drain regions, said array contact pads being electrically insulated from each other. The method includes providing a plurality of storage capacitors including providing a sacrificial layer covering said array contact pads, defining openings in said sacrificial layer, each of said openings being in contact with a corresponding one of said array contact pads, defining an array separation trench in the sacrificial layer at said boundary region, said array separation trench having a surface, providing a storage electrode of a conductive material in each of said openings, respectively, so that each of said storage electrodes is in contact with a corresponding one of said array contact pads, covering the surface of said array separation trench with a first masking material which is different from the material of said sacrificial layer, masking the peripheral portion with a layer of a second masking material which is different from the material of the sacrificial layer, and removing the sacrificial layer from the array portion while maintaining the sacrificial layer in the peripheral portion, providing a storage dielectric on said storage electrode and a counter electrode on said storage dielectric in the array portion thereby completing the plurality of storage capacitors.

One embodiment of the present invention provides a method of forming a memory device that makes use of a sacrificial layer for the definition of the storage capacitors. This sacrificial layer is removed only from the array and maintained in the peripheral portion. In one embodiment, the sacrificial layer is removed from the array portion after providing the storage electrodes.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
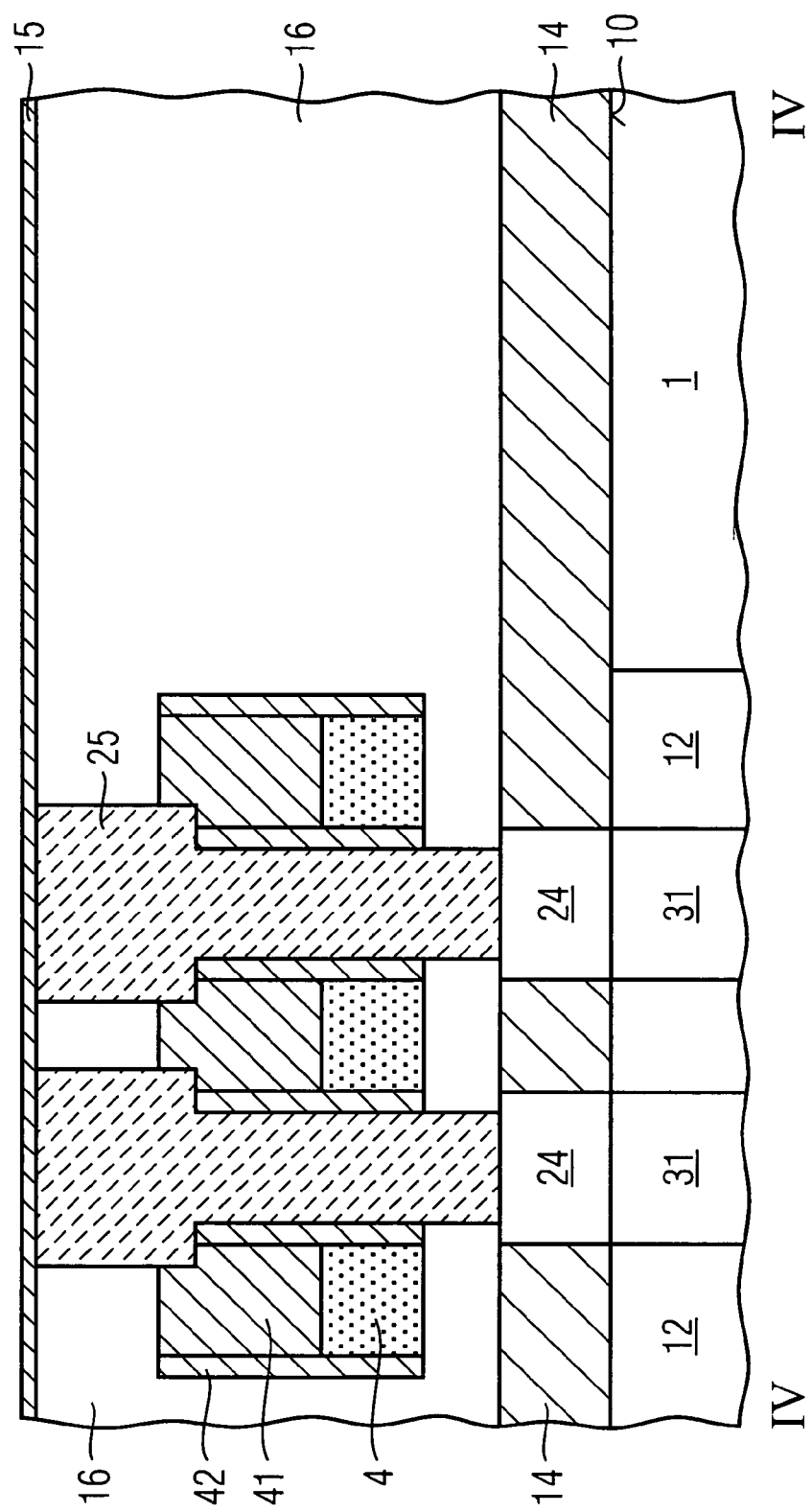
FIGS. 1 to 6 illustrate a method of forming a memory device according to one embodiment of the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a method of forming a memory device with a sacrificial layer. The sacrificial layer in one case is made of silicon dioxide. The etching step for etching the sacrificial layer stops at an array separation trench which laterally protects the peripheral portion from being etched. In one embodiment, the openings and the array separation trench are defined by one etching step of etching the sacrificial layer. In one case, the array separation trench and the openings are formed by the same process steps. Further, in one case a first separation layer, for example made of silicon nitride, is formed on the surface of the array contact pads. The first separation layer is made of a material which is different from the material of the sacrificial layer. Thereby, an etch stop layer is provided on the surface of the array contact pads.

In one embodiment, the surface of the array separation trench is covered with a first masking material. In particular, the first masking material can be filled into the array separation trench. Alternatively, a layer of the first masking material can be deposited on the surface of the array separation trench.

In one embodiment, a layer of the material of the first capacitor electrode is provided simultaneously with a layer which is deposited on the surface of the array separation trench. In one case the first capacitor electrode material layer acts as the first masking material. Thereafter, the openings are filled with the material of the sacrificial layer. In addition, the array separation trench is filled with the material of the sacrificial layer.

According to one embodiment of the present invention, a counter electrode of the stacked capacitor is provided by depositing a layer of polysilicon (polycrystalline silicon) and selectively removing the polysilicon material from the peripheral portion. In particular, the array portion is masked after the step of depositing the polysilicon layer and the polysilicon material is etched from the peripheral portion, wherein the sacrificial layer which covers the peripheral portion and the filling of the array separation trench act as an etch stopping layer.

As a consequence, after the step of removing the material of the counter electrode from the peripheral portion, the sacrificial layer having a well defined thickness is still present in the peripheral portion. Hence, an etching step for etching contacts in the sacrificial layer can be performed easier.

The diameter of the array separation trench is selected in accordance with the overlay tolerances of the lithographic steps employed. Moreover, the diameter of the array separation trench depends on the minimal structural feature size F which is obtainable by the technology employed. For example, F can be around 100 nm or below, for example, 30 to 70 nm. When removing the material of the counter electrode from the peripheral portion, a lithographic step for patterning the block mask which covers the array portion has to be performed. In addition, if the material of the storage electrode is to be filled in the array separation trench, a diameter of the array separation trench should not be smaller than 0.5×F. In particular, a diameter of the array separation trench of 0.5 to 2.0 F, and, in particular, 50 to 200 nm is preferred.

Suitable materials of the storage electrode and the counter electrode having polysilicon and W/TiN. The capacitor dielectric is made of the dielectric material as is usually employed, especially, $SiO_2$, $Si_3N_4$, SiON and high-k dielectrics such as $Al_2O_3$ or Aluminium-Hafnium-Oxide.

In one embodiment of the present invention, a method of forming a memory device including providing a semiconductor substrate having a surface, providing an array portion having an array of access transistors, each of said access transistors having a first and a second source/drain regions, a channel disposed between said first and second source/drain regions and a gate electrode which is electrically insulated from said channel and adapted to control the conductivity of said channel, each of said access transistors being at least partially formed in said semiconductor substrate. The method includes providing a peripheral portion having peripheral circuitry, said peripheral portion being at least partially formed in said semiconductor substrate, a substrate portion between said peripheral portion and said array of access transistors defining a boundary region. The method includes providing a plurality of array contact pads connected with said first source/drain regions. The array contact pads are electrically insulated from each other. The method includes providing a plurality of storage capacitors, the step of providing said storage capacitors includes providing a sacrificial layer covering said array contact pads, defining openings in said sacrificial layer, each of said openings being in contact with a corresponding one of said array contact pads, defining peripheral contact openings in said sacrificial layer, each of said peripheral contact openings being in contact with part of said peripheral circuitry, providing a storage electrode of a conductive material in each of said openings so that said storage electrode is in contact with one of said array contact pads, masking the peripheral portion with a layer of a second masking material which is different from the material of the sacrificial layer, removing the sacrificial layer from the array portion while maintaining the sacrificial layer in the peripheral portion, providing a storage dielectric on said storage electrode and a counter electrode on said storage dielectric in the array portion thereby completing the plurality of storage capacitors, and providing a conductive material in said peripheral contact openings so as to complete a plurality of peripheral contacts.

Accordingly, in one embodiment of the method of forming a memory device, the stacked capacitors as well as the peripheral contacts for contacting the peripheral circuitry are formed by simultaneous process steps.

As a result, the method of forming the memory device is simplified. In particular, the step of etching a contact hole through the thick insulating layer is relaxed since due to this method, a reduced thickness of the insulating layer has to be etched. In particular, peripheral contact pads are not necessary for providing the peripheral contacts. To be more specific, the peripheral contact pads are not essential, but in one embodiment they will accomplish an easier overlay of the contacts.

According to one embodiment of the present invention, a memory device includes an array portion with an array of memory cells, said memory cells being at least partially formed in a semiconductor substrate having a surface. Each of said memory cells includes an access transistor with a first and a second source/drain region, a channel disposed between said first and second source/drain region and a gate electrode which is electrically insulated from said channel and adapted to control the conductivity of said channel. The access transistor is at least partially formed in said semiconductor substrate, and a storage capacitor for storing an information, said storage capacitor being adapted to be accessed by said access transistor. The storage capacitor has at least a first and a second storage electrode and at least a capacitor dielectric being disposed between said first and second storage electrode, wherein each of said first and second storage electrode is disposed above said substrate surface. A contact between said first storage electrode and said first source/drain region of said access transistor is accomplished by a capacitor contact and a contact pad, said capacitor contact extending from said substrate surface and connecting said substrate surface with said contact pad. The contact pad is adjacent to said first capacitor electrode, and a peripheral portion including peripheral circuitry for controlling a read and a write operation of said memory cell array, said peripheral circuitry being connected with said memory cell array, a substrate portion between said peripheral portion and said array portion defining a boundary region, and an array separation trench being positioned at said boundary region.

In particular, the memory device of one embodiment of the present invention includes an array separation trench which is located at a boundary region between the array portion and the peripheral portion of the memory device. Due to the array separation trench, a lateral etch stop is provided which prevents the peripheral portion from being etched when performing an etching step in the array portion and vice versa. In particular, the array separation trench extends to at least the bottom side of the sacrificial layer.

In addition, the memory device in one embodiment includes array contact pads, wherein each of the array contact pads are in contact with a first source/drain region of a corresponding one of the access transistors. In one case, the memory device further includes a first insulating layer which is formed on the array contact pads. Moreover, in one case, that the array separation trench extends below the bottom side of the first insulating layer. In this case, an etch stop can be provided very efficiently.

A method according to one embodiment of the present invention is, for example, illustrated in FIG. 1. In the lower portion of FIG. 1, a semiconductor substrate 1, such as a silicon substrate, is illustrated. The illustrated cross-sectional view is taken along IV and IV in FIG. 27. In particular, the cross-section is taken perpendicular to the direction of the current flow of the transistor. On the surface 10 of the semiconductor substrate 1, a BPSG layer 14 is provided. In addition, capacitor contacts 24 are connected with the first source/drain regions 31 of the access transistors. In addition, array contact pads 25 are formed so as to be in contact with the capacitor contacts 24. The array contact pads 25 are insulated from each other by the $SiO_2$ layer 16. In addition, the M0 wiring layer 4, which usually have the bit lines, is formed at a level which is above the first source/drain regions 31. The M0 wiring layer 4 further having a $Si_3N_4$ cap layer 41 as well as $Si_3N_4$ spacers 42. The M0 wiring layer 4 is connected with the second source/drain regions (not illustrated in this Figure) in a cross-sectional view which is taken in a plane in front of or behind the depicted cross-sectional view. In addition, a $Si_3N_4$ etch stop layer 15 is provided on top of the resulting surface, in particular on top of the array contact pads 25 and the $SiO_2$ layer 16.

Figure 2:
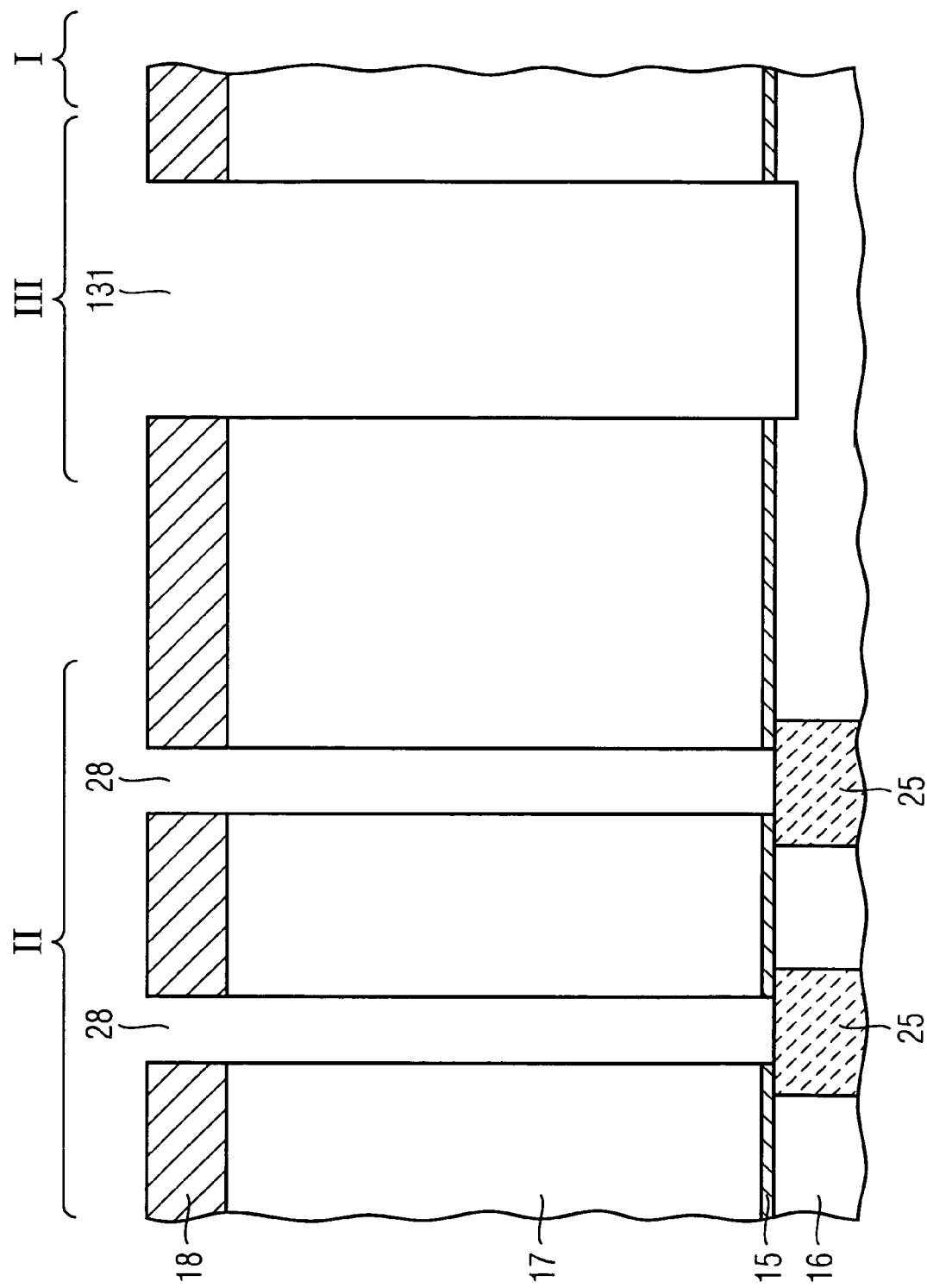

For implementing the method of one embodiment of the present invention, as is illustrated in FIG. 2, a sacrificial layer 17, for example made of $SiO_2$, is deposited on the surface of the $Si_3N_4$ layer 15. The thickness of the sacrificial layer 17 corresponds to the height of the capacitor to be formed and can, in particular, be 1,5 to 3 µm. Thereafter, a hard mask layer 18, for example made of polysilicon, is deposited on the sacrificial layer 17. Thereafter, openings are photolithographically defined in the hard mask layer 18 and patterned in the sacrificial layer 17. In particular, in the array portion, capacitor openings 28 are defined whereas a trench opening 131 is defined at the boundary region between the array portion and the peripheral portion of the memory device. For example, the capacitor opening 28 can have a diameter of 70 nm, whereas the trench opening 131 has a diameter of about 100 nm. The trench opening 131 extends to the bottom side of the sacrificial layer 17. For example, the array contact pads 25 can act as an etch stopping layer. Moreover, the silicon nitride layer 15 can as well act as an etch stopping layer. According to one embodiment, the openings 28, 131 are etched, this etching stopping on the silicon nitride layer 15. Thereafter, a selective etching step of etching silicon nitride is performed so as to obtain the openings 28, 131 as illustrated in FIG. 2.

In particular, in one embodiment the openings 28, 131 are etched by a common etching step.

Figure 3:
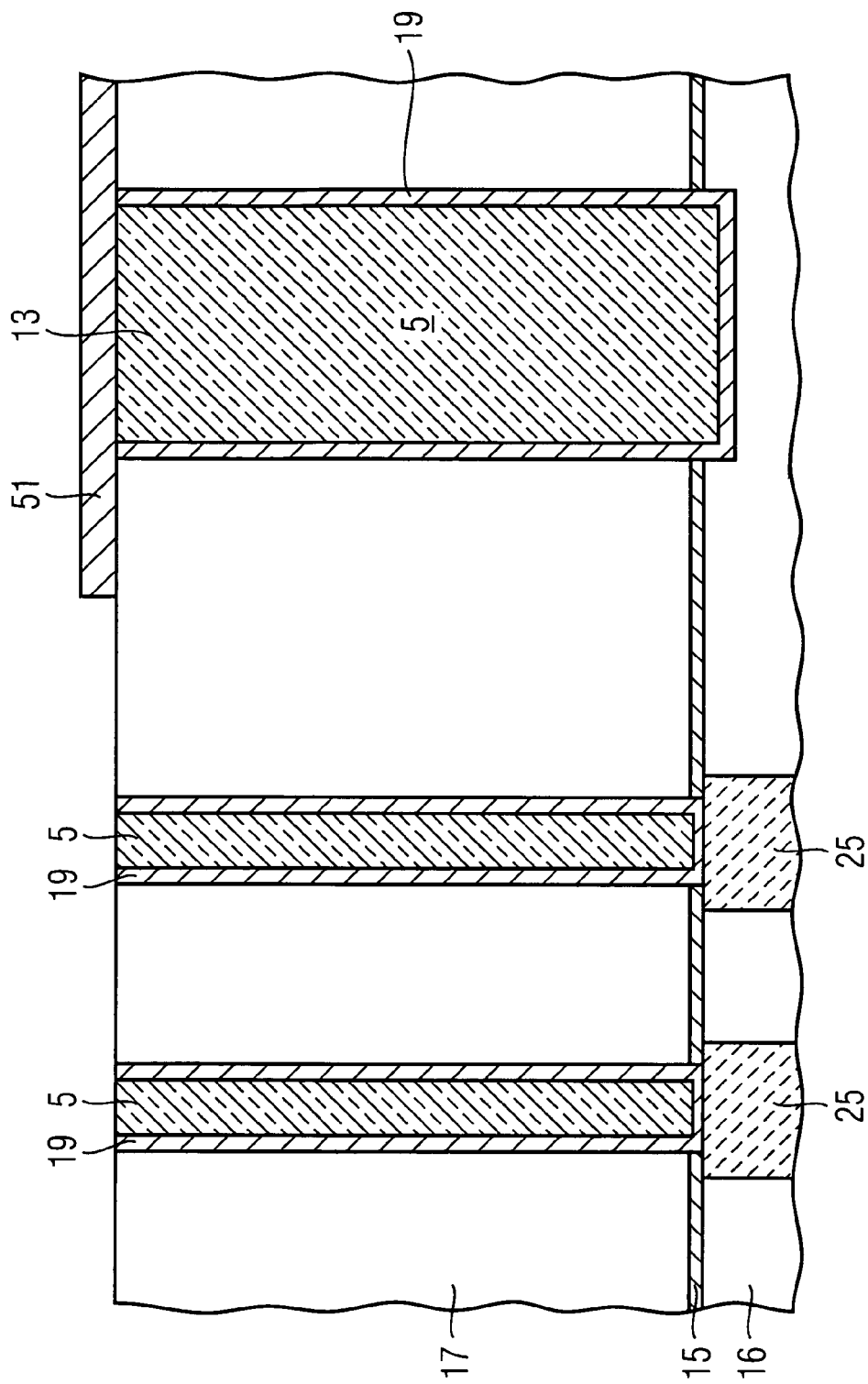

In the next step, a process for forming a stacked capacitor is performed. In particular, a polysilicon layer is deposited so as to cover the inner surface of the capacitor openings 28, the polysilicon layer 19 covering as well the inner surface of the trench opening 131. Thereafter, a $SiO_2$ filling 5 is deposited so as to completely fill the trench openings 131 as well as the capacitor openings 28. Then, the CMP (Chemical Mechanical Polishing) step is performed so as to planarize the surface and remove the silicon dioxide layer and the polysilicon layer 19 from the horizontal substrate surface. Then, a further polysilicon layer is deposited and patterned so as to form a peripheral hard mask 51 covering the peripheral portion as well as the filled array separation trench 13. By this patterning step, the array portion is uncovered, as can be seen from FIG. 3. In the next step, a wet etching step with DHF (diluted fluoric acid) is performed, so as to remove the sacrificial layer 17 from the array portion. Since the array separation trench 13 is provided in the boundary region, and, additionally, the peripheral hard mask layer 51 is provided, this etching step does not attack the peripheral portion, whereas the sacrificial layer 17 is completely removed from the array portion. Thereafter, a dielectric layer 22, which can, for example be made of $SiO_2$, $Si_3N_4$, $Al_2O_3$ or AlHfO is deposited on the whole substrate surface.

Figure 4:
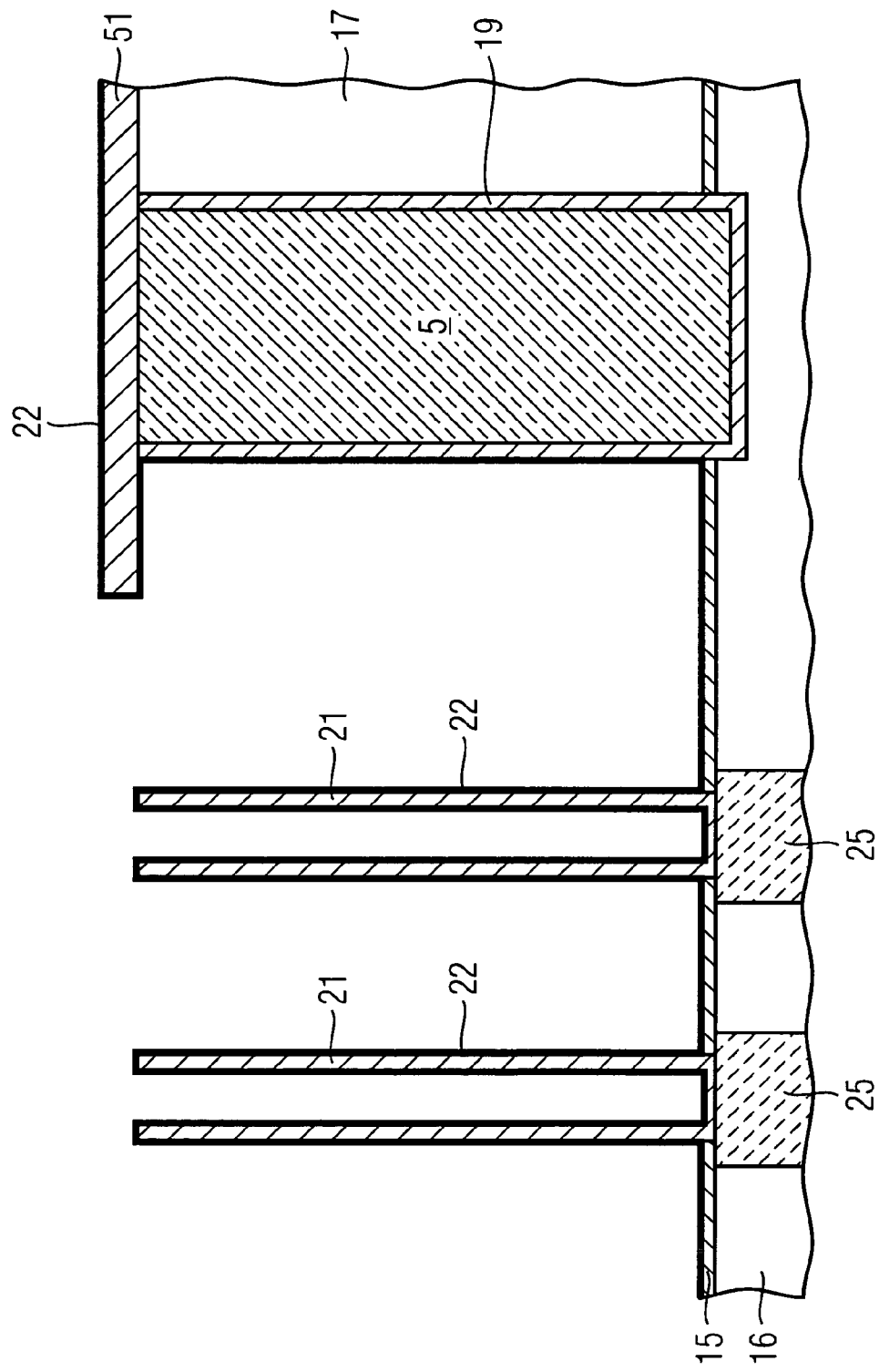

The resulting structure is illustrated in FIG. 4. As can be seen from FIG. 4, the storage electrode 21 is formed in the array portion as a free-standing structure, being covered with the dielectric layer 22. The dielectric layer 22 is as well deposited on the peripheral portion.

In the next step, the material of the counter electrode 23 is deposited on the whole substrate surface. Thereafter, the array portion is covered with a suitable resist material. The resist material is lithographically patterned so as to cover the array portion only. Then, an etching step for etching the material of the counter electrode, which can especially be polysilicon, is performed, whereby the polysilicon material is removed from the peripheral portion. In addition, the dielectric layer and the polysilicon layer 51 are removed from the peripheral portion. As a consequence, the sacrificial layer 17 in the peripheral portion as well as the surface of the array separation trench 13 now are uncovered. The resulting structure is illustrated in FIG. 5.

Figure 5:
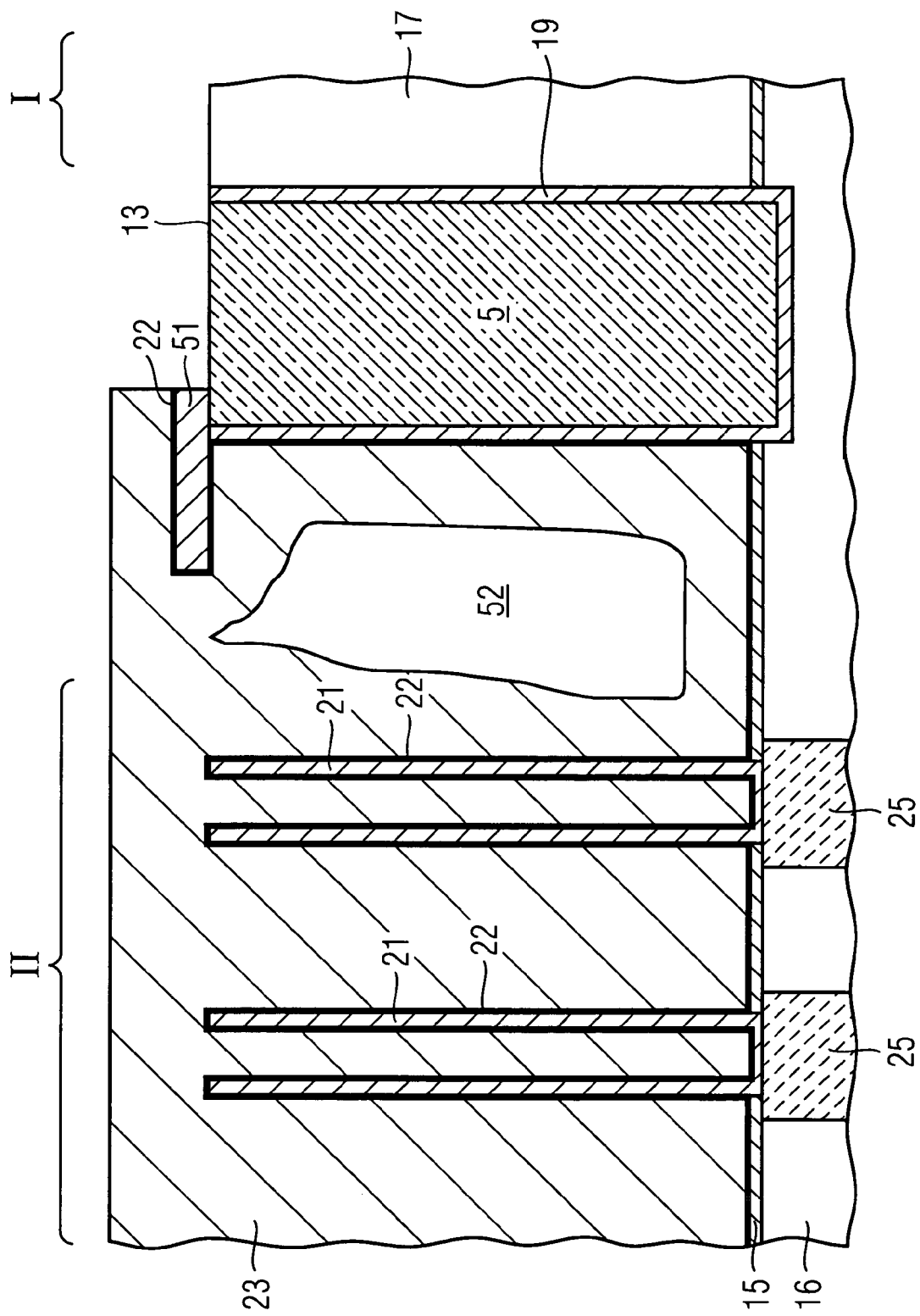

As can be seen from FIG. 5, in the array portion, the counter electrode material 23 is provided and a void 52 can be formed. This void 52 will not degrade the characteristics of the resulting memory device. In addition, in the peripheral portion, the sacrificial layer 17 as well as the filling of the array separation trench 13 are uncovered.

Figure 6:
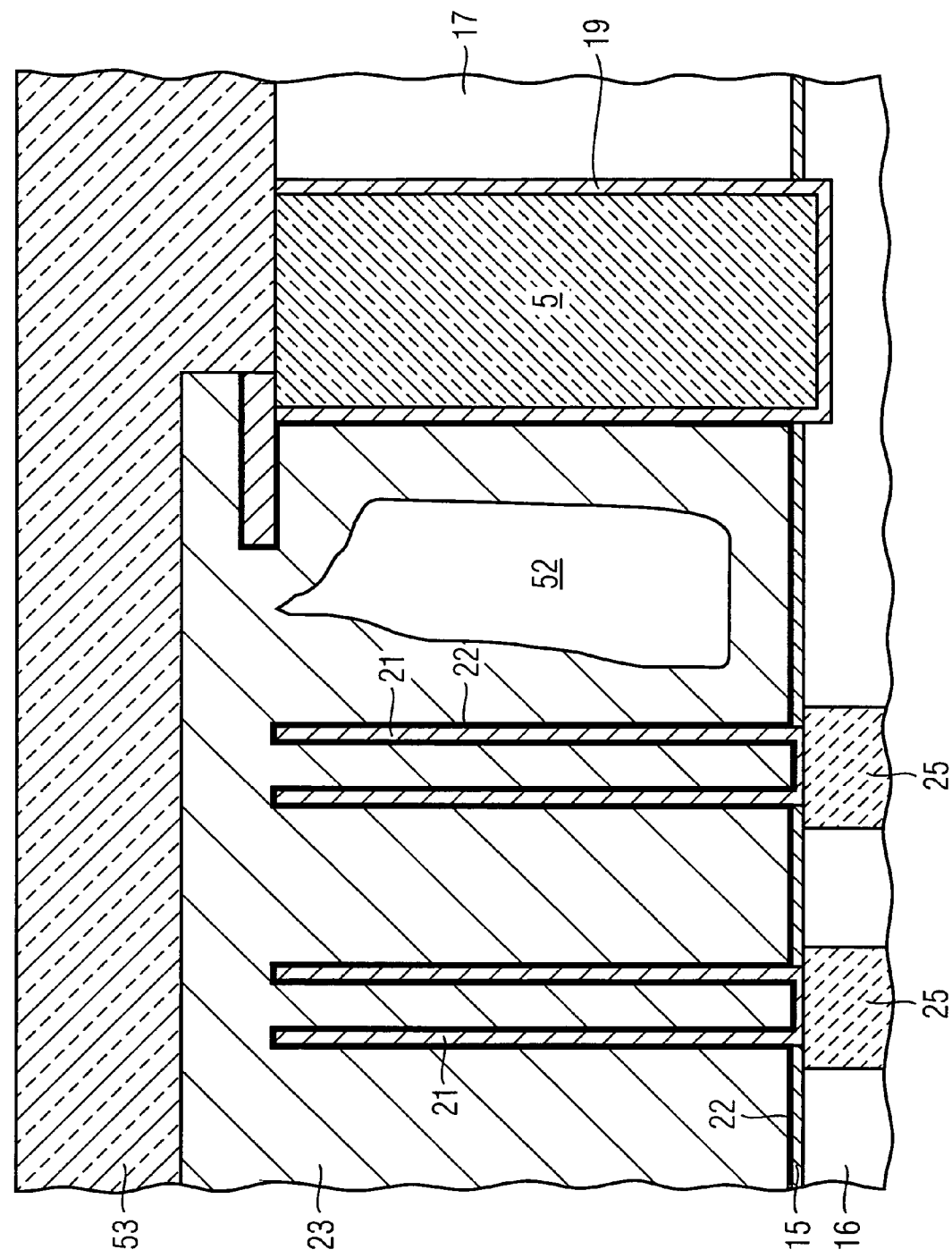

Thereafter, a silicon dioxide layer 53 is deposited as is usual. The resulting structure is illustrated in FIG. 6.

As can further be seen, the $SiO_2$ layer 53 has a moderate thickness, the difference in topography between the array portion II and the peripheral portion I, not being large.

If the steps which have been described with reference to FIGS. 4 and 5, in particular, the steps of selectively removing the sacrificial layer from the array portion and selectively removing the material of the counter electrode from the peripheral portion, had not been performed, a large topography would have been created in the structure illustrated in FIG. 6. In particular it would have been necessary to deposit and planarize an additional oxide layer in the peripheral portion. In contrast, as is illustrated in FIG. 6, the polysilicon layer 23 has approximately the same height as the sacrificial layer 17 in the peripheral portion. As a consequence, in order to provide a silicon dioxide layer in the peripheral portion, a silicon dioxide layer 53 having a reduced thickness with respect to known processes is deposited on a nearly planar surface, resulting in a smooth surface of the layer 53. Accordingly a planarizing step can be omitted. For example, the silicon dioxide layer 53 has a thickness of 300 to 500 nm.

In the next step, the memory device is completed in a manner which is generally known to persons skilled in the art.

Figure 7:
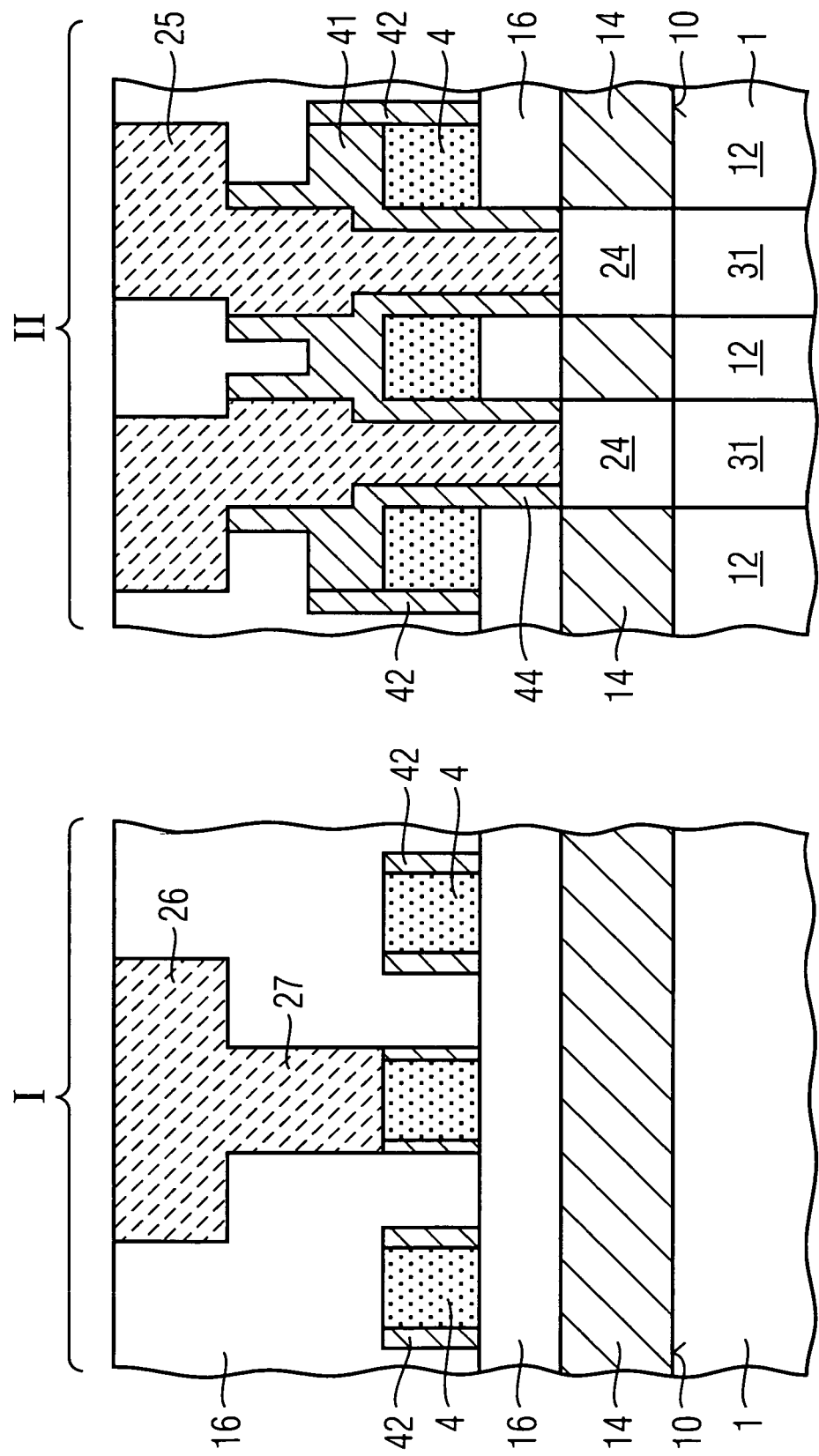
FIGS. 7 to 24 illustrate steps of the method of forming a memory device according to one embodiment of the present invention.

FIGS. 7 to 24 illustrate another embodiment of the present invention, in which the storage capacitor in the array portion and the so-called C1 contact in the peripheral portion are provided by common process steps. The starting point for implementing one embodiment of the present invention is illustrated in FIG. 7. The right hand portion of FIG. 7 illustrates a cross-sectional view of the array portion II whereas the left-hand cross-section illustrates a cross-sectional view of the peripheral portion I. As is illustrated in FIG. 7, in the peripheral portion, on the surface 10 of a semiconductor substrate 1 such as, for example, a silicon substrate, there is provided a BPSG layer 14, followed by a $SiO_2$ layer 16. An M0 wiring layer 4 is provided and some of the lines of the M0 wiring layer are connected with a peripheral contact pad 26 via a conductive filling 27. At the surface of the structure illustrated in FIG. 7, there is illustrated the peripheral contact pad 26, insulated from the other components by a $SiO_2$ layer 16.

In the array portion II, there is illustrated a plurality of first source/drain regions 31, insulated from each other by isolation trenches 12 which are filled with an insulating material. The first source/drain regions 31 are connected with array contact pads via the capacitor contacts 24. The capacitor contacts 24 are insulated from each other by a BPSG layer 14. In addition, the M0 wiring layer 4 is provided in the array portion. The cross-section illustrated in FIG. 7 is taken in a direction perpendicular to the direction of the channel of the transistor, so that only the first source/drain region 31 of the transistor is illustrated. The second source/drain regions 32 of the transistor are arranged in front of or behind the illustrated drawing plane. On the surface of the array contact pads 25, the stacked capacitor is to be formed in the next process steps.

Figure 8:
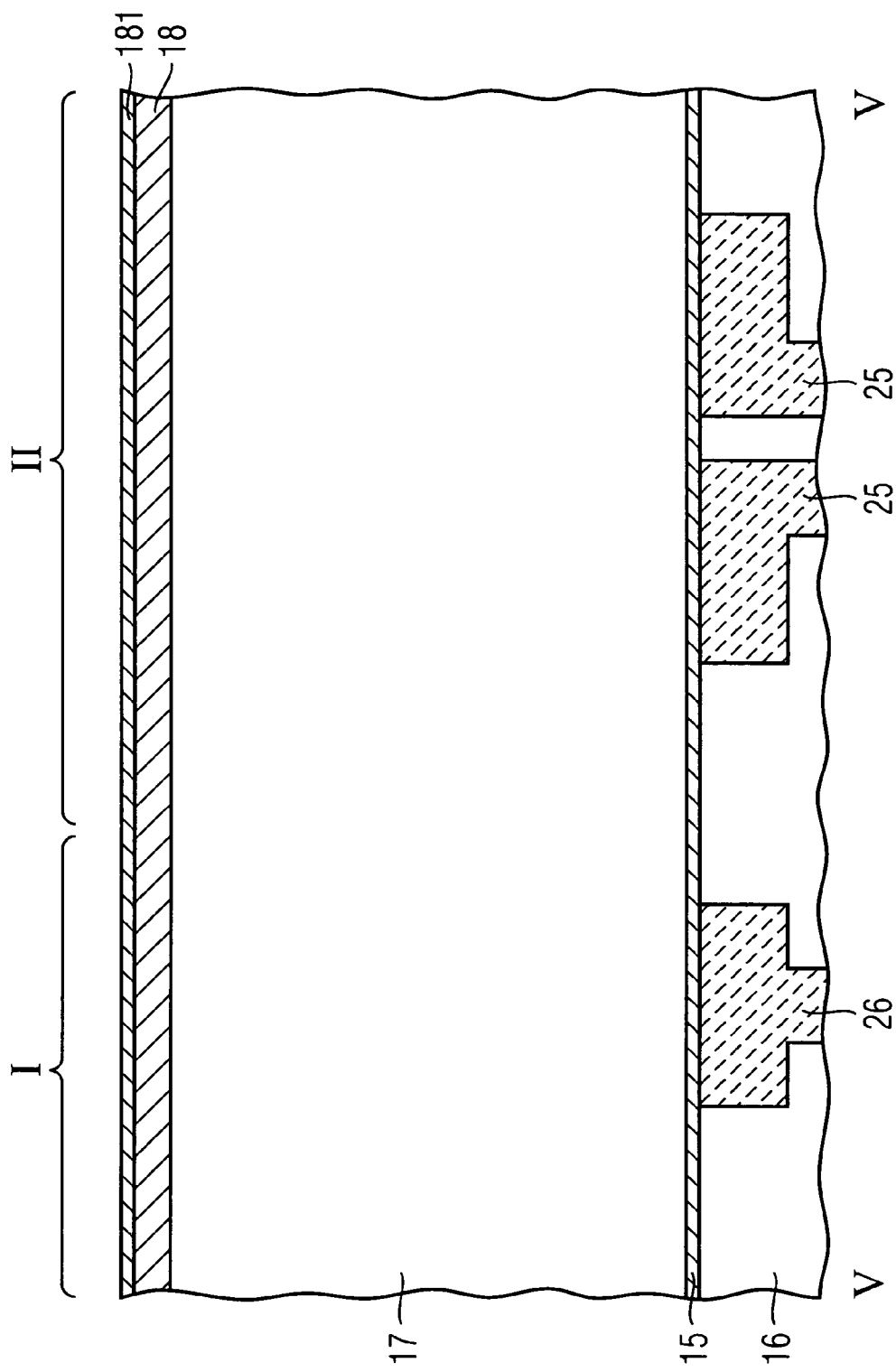

Starting from the structure illustrated in FIG. 7, first a thin silicon nitride layer 15 is deposited on the surface. Thereafter, a thick insulating layer 17, such as made of $SiO_2$, is deposited on the surface of the silicon nitride layer 15. The thickness of the insulating layer 17 approximately corresponds to the height of the completed stacked capacitor which is to be formed. Thereafter, a polysilicon hard mask layer 18 is deposited, followed by a $Si_3N_4$ hard mask layer 181. The resulting structure is illustrated in FIG. 8. In particular, the cross-sectional view of FIG. 8 is taken between V and V as can be seen from FIG. 27.

Figure 9:
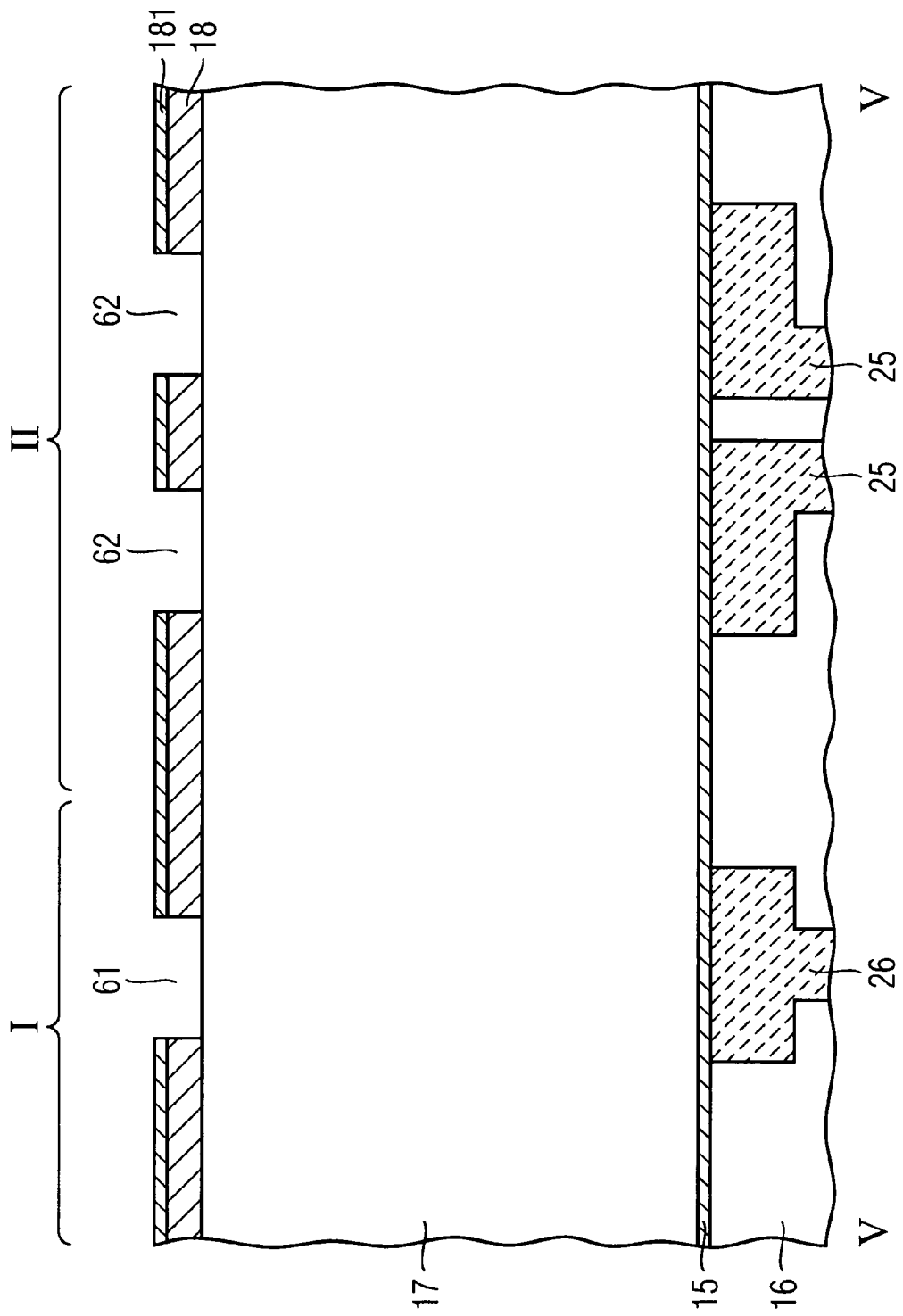

Thereafter, openings 61, 62 are formed in the hard mask layers 181, 18. In particular, the support opening 61 is formed at a position above the peripheral contact pad 26, whereas array openings 62 are formed at a position above the array contact pads 25. This is illustrated in FIG. 9.

Then, a high aspect ratio etching step for etching the silicon dioxide layer 17 is performed.

Figure 10:
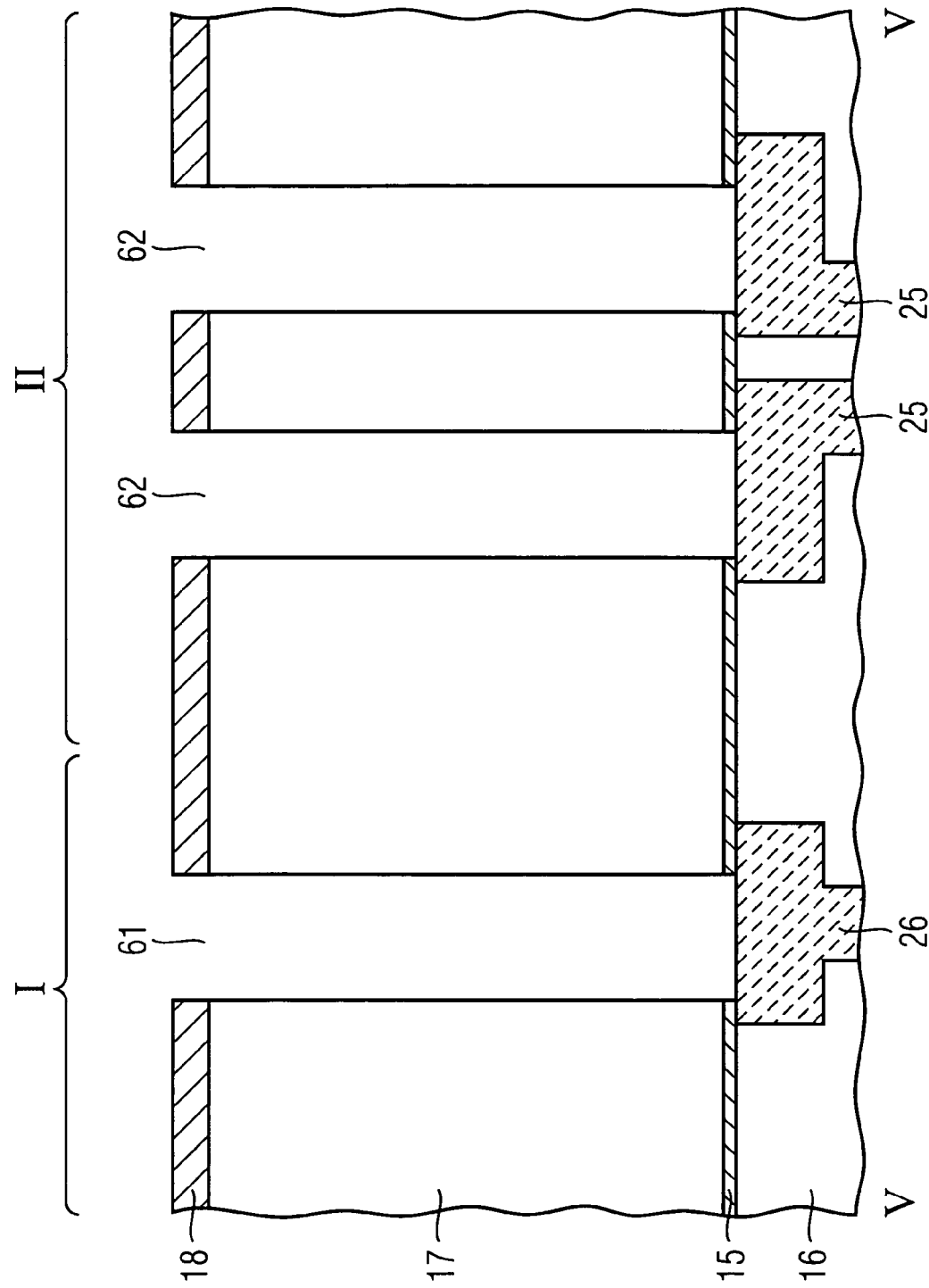

As is illustrated in FIG. 10, the openings 61, 62 are etched so that the opening 61 will be connected with the peripheral contact pad and the array openings 62 will be in contact with the array contact pads, respectively.

Figure 11:
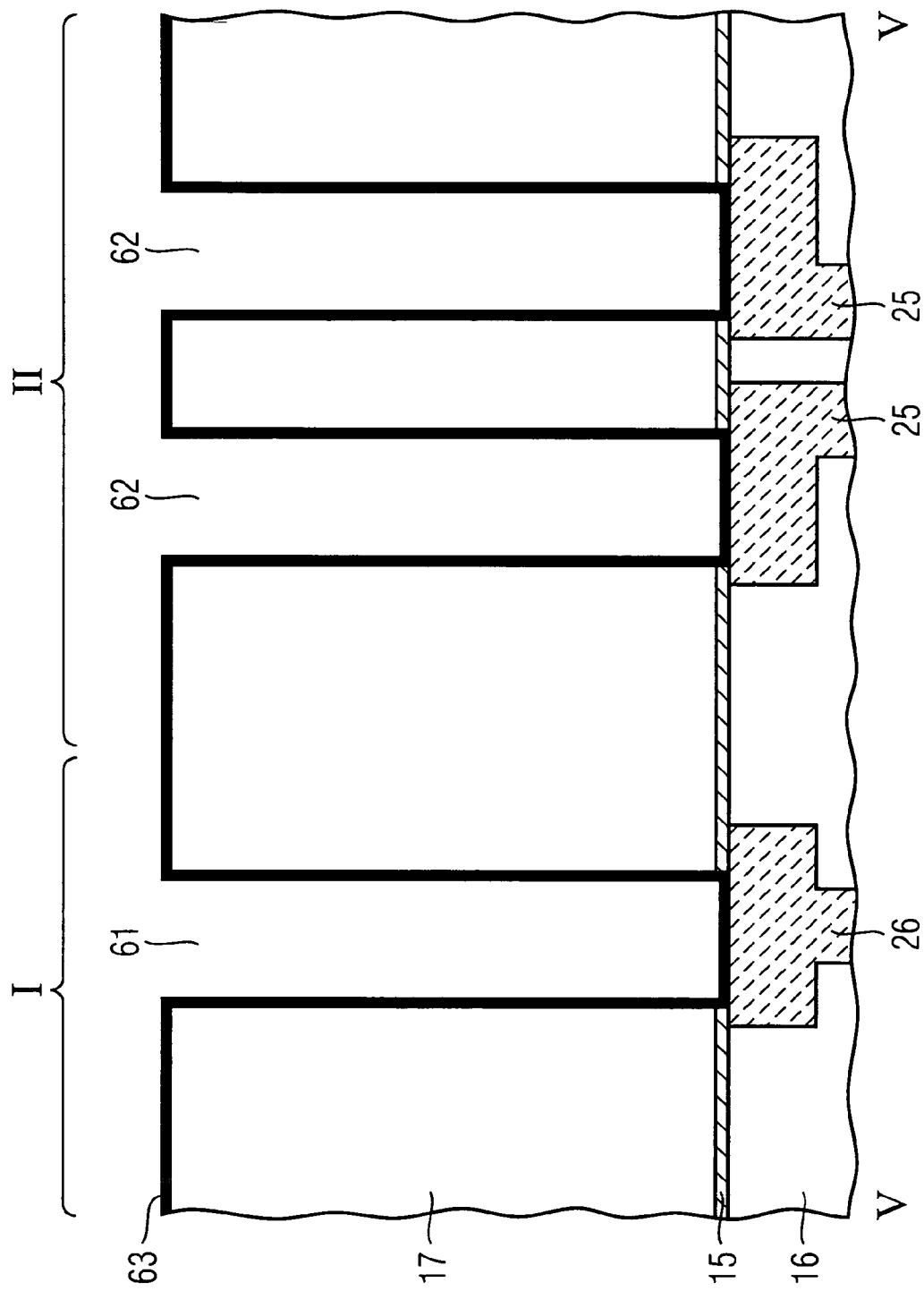
Figure 12:
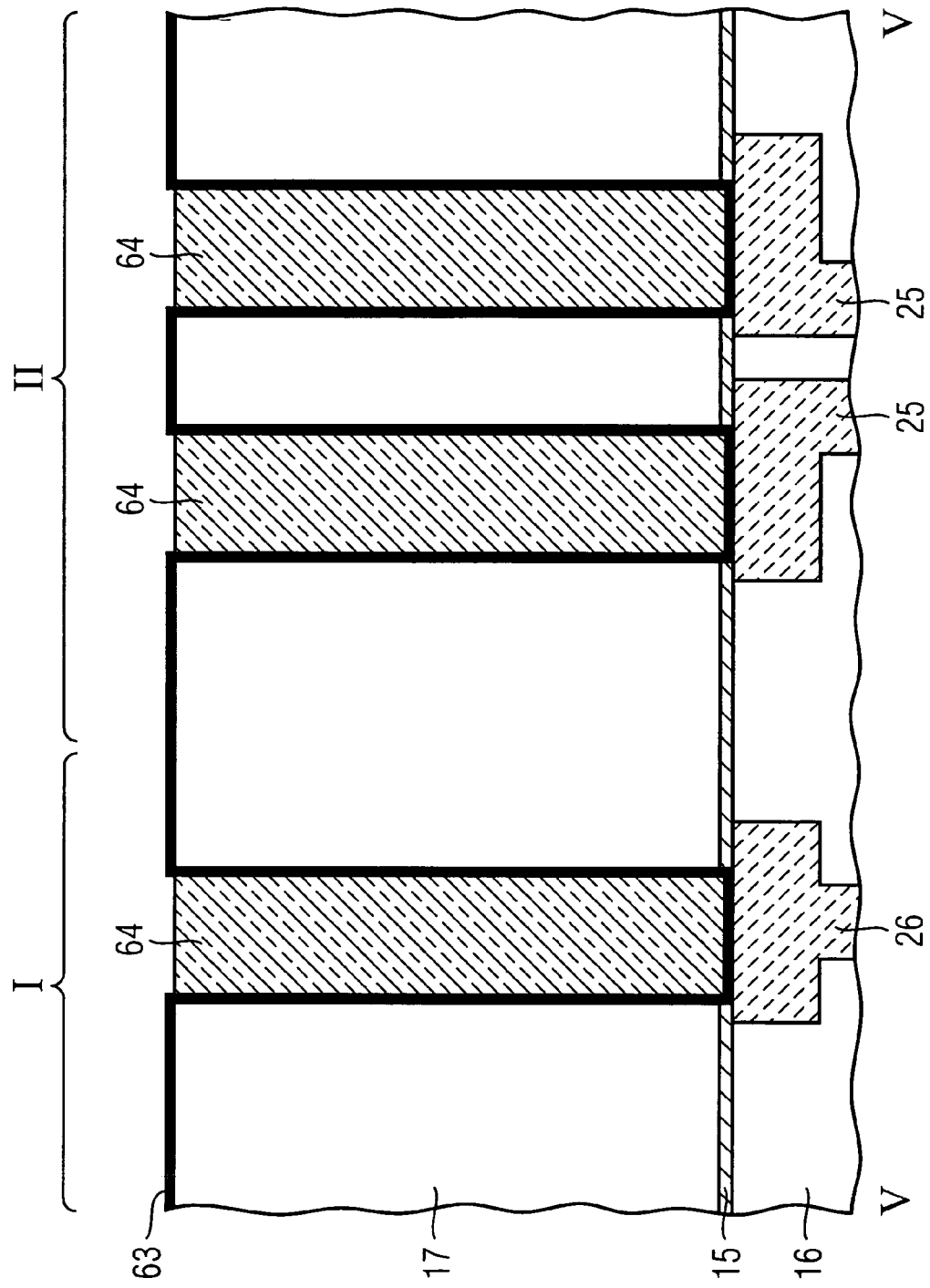

After removing the residues of the $Si_3N_4$ and the polysilicon hard mask layers 181, 18 a thin TiN liner 63 is deposited on the resulting surface so as to cover the horizontal and the vertical portions of the surface of the defined structure. The liner 63 can be made of any conductive material which may be etched selectively with respect to the material of the insulating layer 17. The resulting structure is illustrated in FIG. 11. In the next step, as can be taken from FIG. 12, a sacrificial silicon dioxide filling 64 is provided in the openings 61, 62, and a CMP step is performed to obtain a planarized surface.

Figure 13:
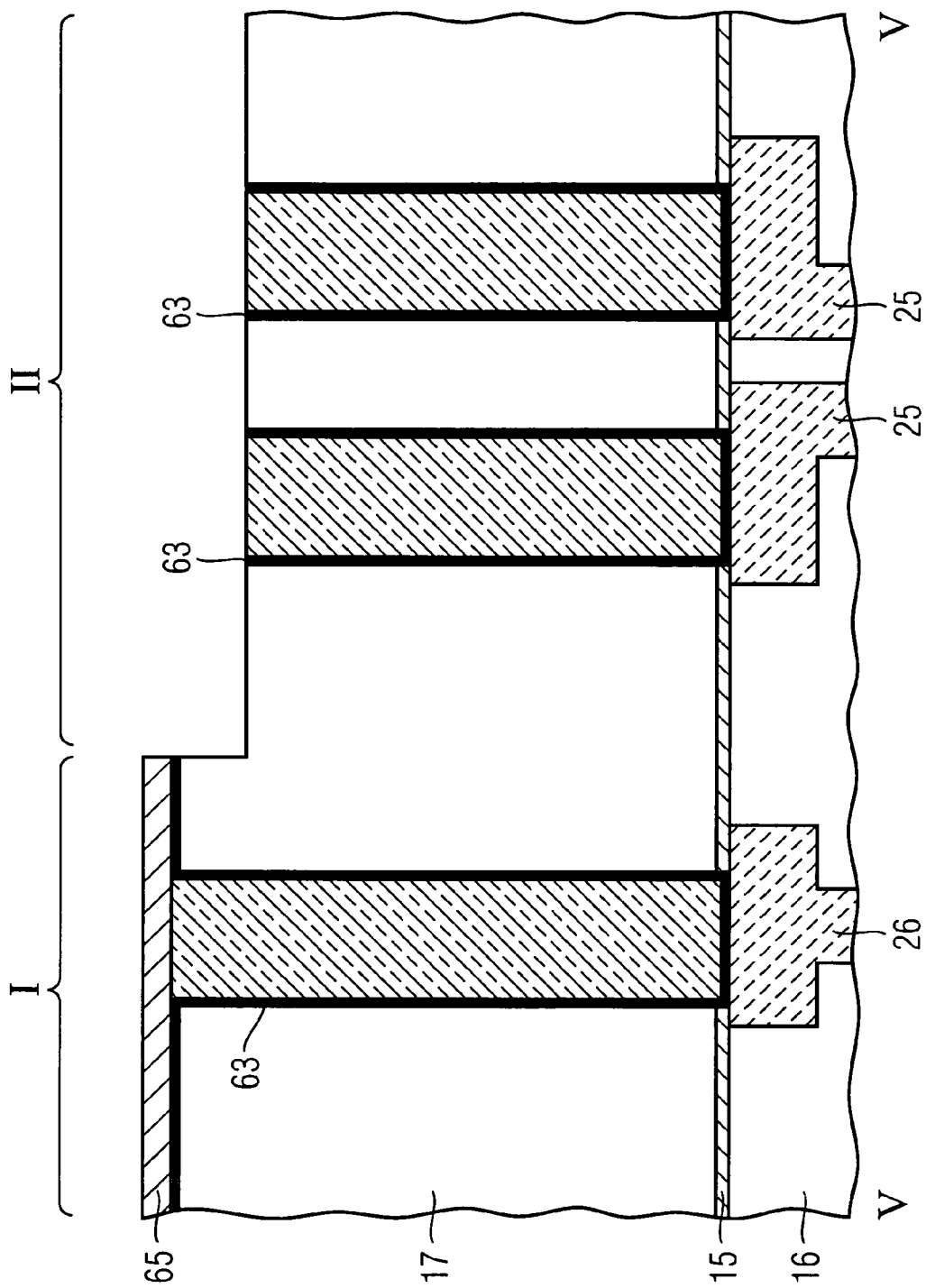

Thereafter an additional hard mask layer is provided and patterned so as to mask the peripheral portion I only. For example, a polysilicon layer 65 can be provided on the peripheral portion and can be lithographically patterned and etched, this etching step stopping on the TiN liner, so as to leave the array portion II uncovered. In addition, an etching step of etching TiN and silicon dioxide is performed so that the array portion is recessed with respect to the peripheral portion I. The resulting structure is illustrated in FIG. 13. As can be seen, in the array portion II the TiN liner 63 extends to a lower height than in the peripheral portion I.

In the next step, the insulating layer 17 will be removed from the array portion II. Since the peripheral portion I is covered by the hard mask layer 65, the silicon dioxide layer 17 will not be removed from the peripheral portion I. In particular, this can especially be accomplished if additionally an array separation trench 13 is provided in the manner as has been described in the embodiment of the invention with reference to FIGS. 1 to 7.

Figure 14:
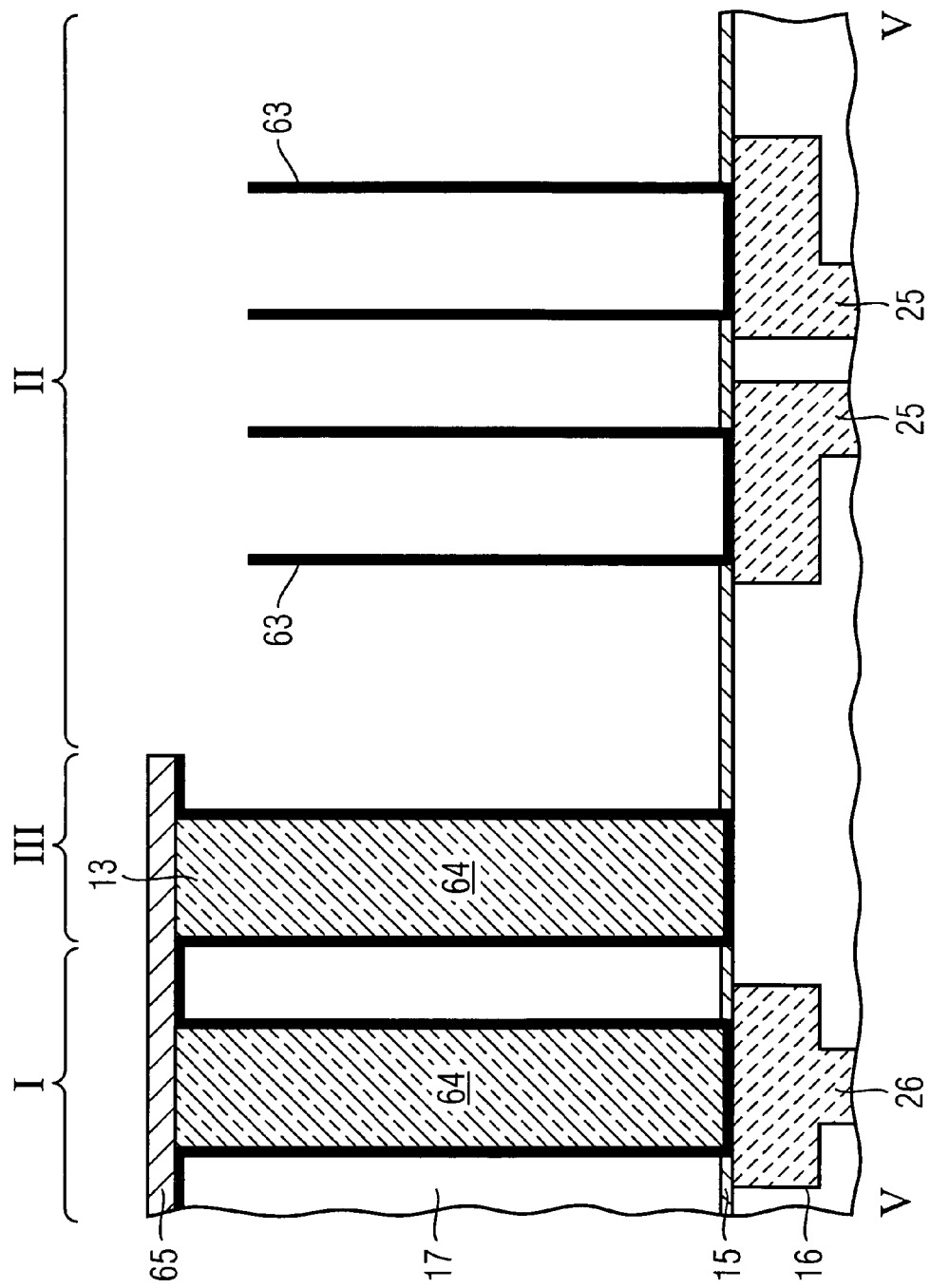
Figure 15:
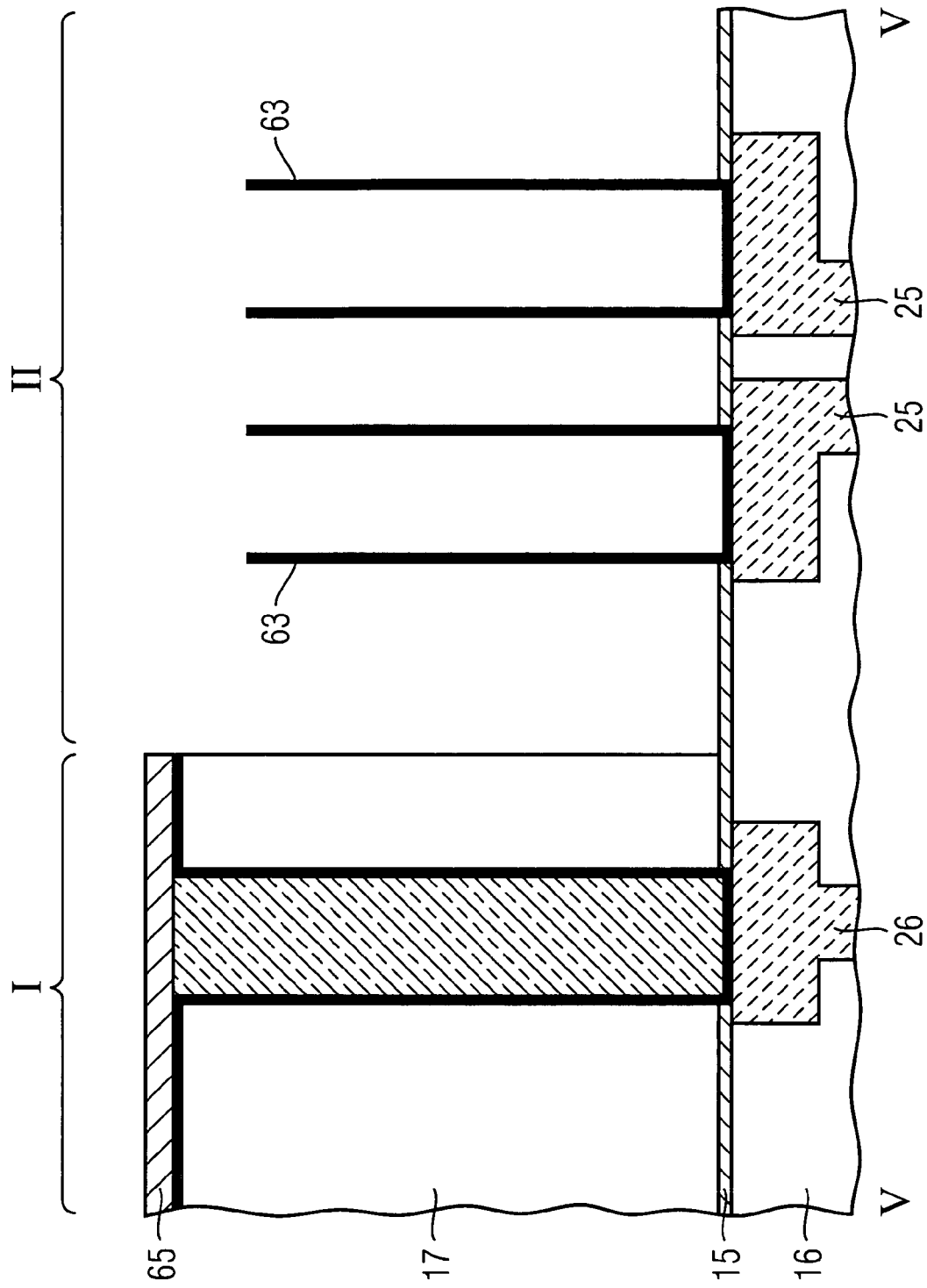
Figure 16:
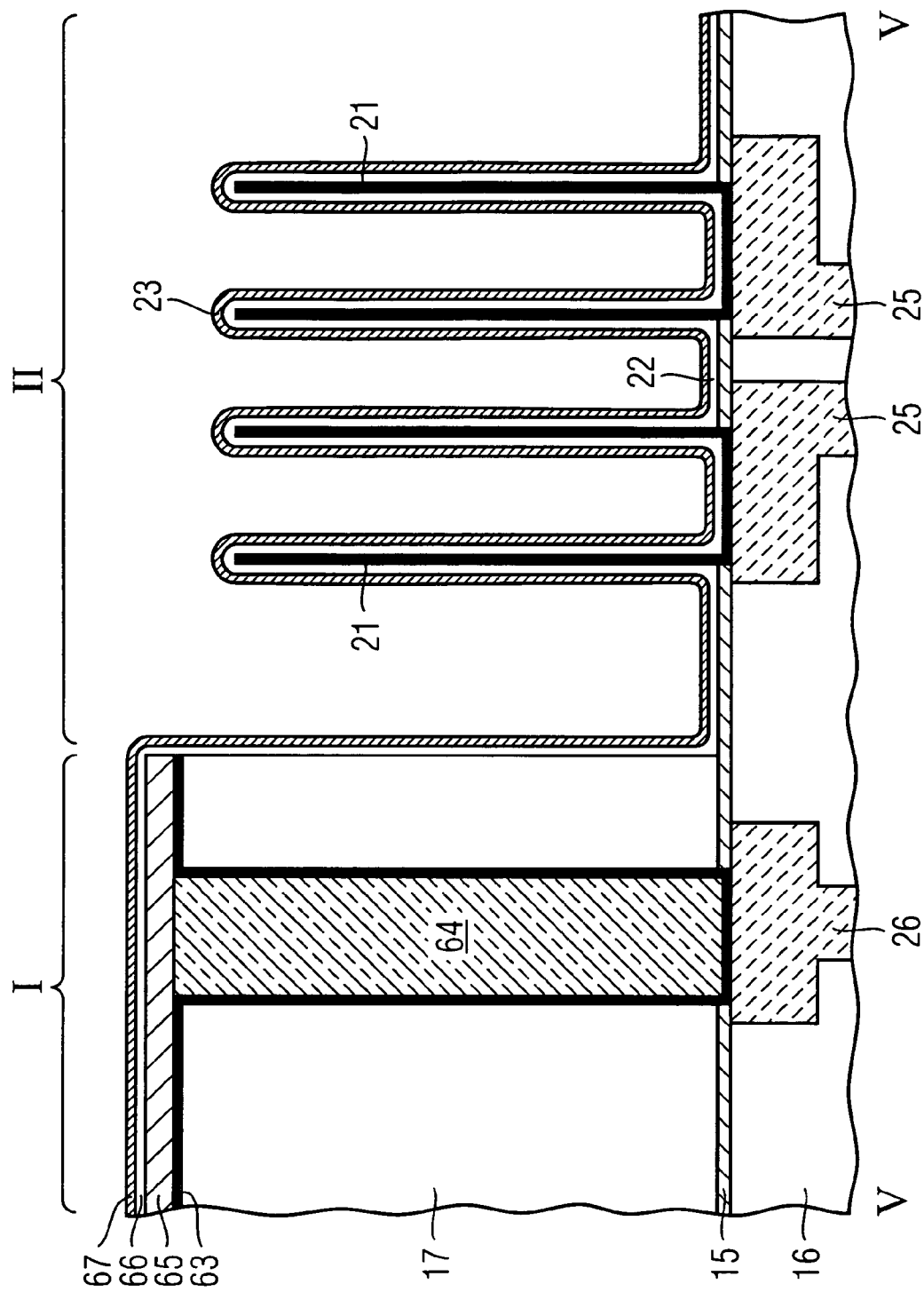
Figure 17:
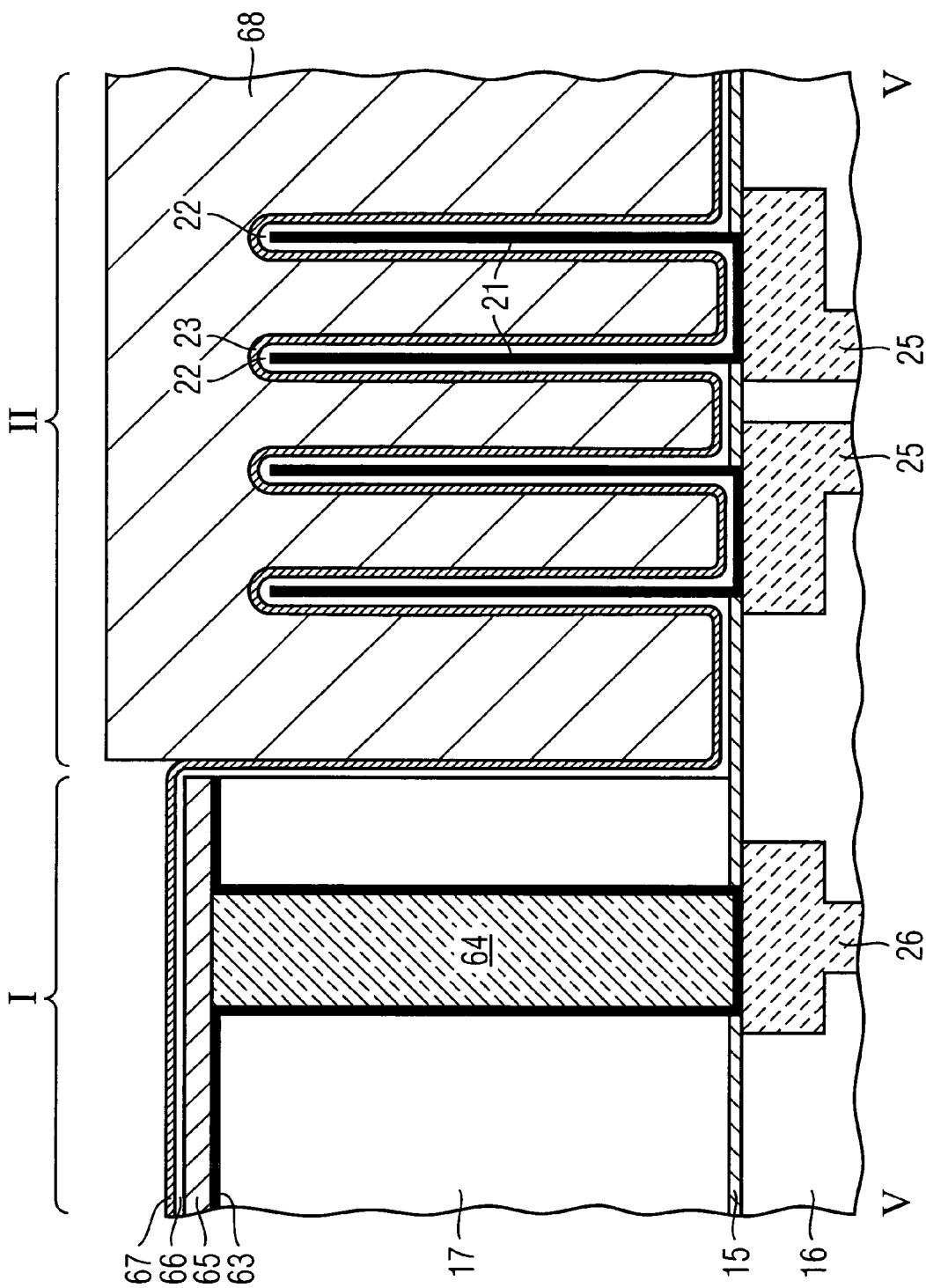

FIG. 14 illustrates a cross-sectional view of the structure. The illustrated structure includes the array portion II in which the silicon dioxide layer 17 is removed, the silicon dioxide layers 17 being maintained in the peripheral portion I. In addition, in FIG. 14, the boundary region III includes the array separation trench 13. For convenience, the separation trench 13 is not drawn in the following Figures. As is clearly to be understood, by employing, for example, an anisotropic etching step, the silicon dioxide layer 17 can be removed from the array portion while maintaining the silicon dioxide layer 17 in the peripheral portion as well. FIG. 15 illustrates the resulting structure after the silicon dioxide layer 17 has been removed from the array portion. In the next step as is illustrated in FIG. 16, the dielectric layer 22 is deposited, followed by a TiN layer 23 which acts as a counter electrode of the resulting storage capacitor. The dielectric layer 22 can in particular be made of a high-k dielectric such as $Al_2O_3$ or others. As can be taken from FIG. 16, the dielectric layer 66 as well as the conductive layer 67 are deposited in the peripheral portion as well.

In the next step, an inverse block mask is provided on the array portion II. The inverse block mask 68 can be made of a suitable resist material, in particular, photoresist or silicon dioxide. The layer of the masking material is deposited and, thereafter, it is lithographically patterned so that only the array portion II is covered with the mask material, leaving the peripheral portion I uncovered.

Figure 18:
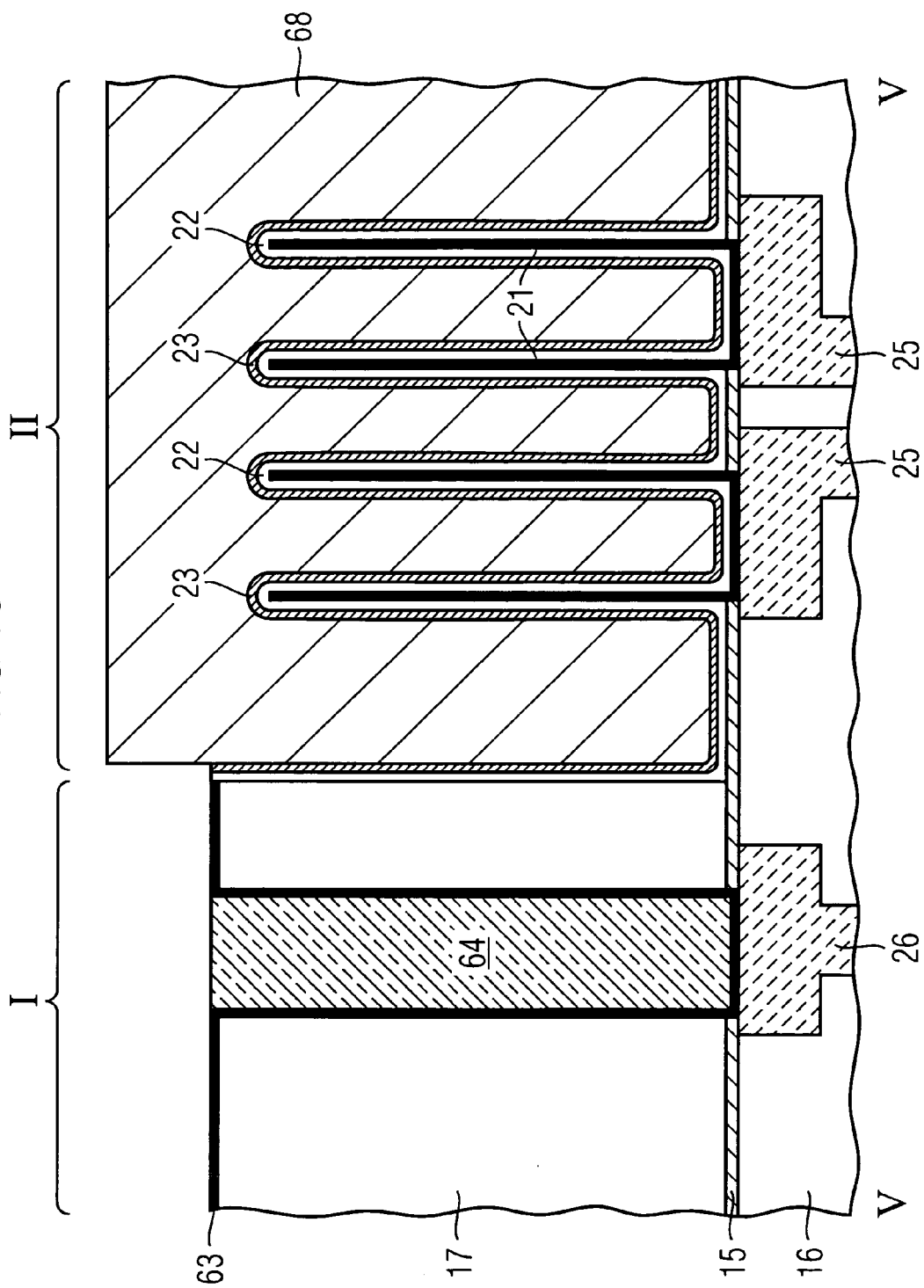

Then, the TiN layer 67, the dielectric layer 66 as well as the hard mask layer 65 are removed by etching, this etching step stopping on the surface of the TiN liner 63 and on the surface of the silicon dioxide filling 64. The resulting structure is illustrated in FIG. 18.

Figure 19:
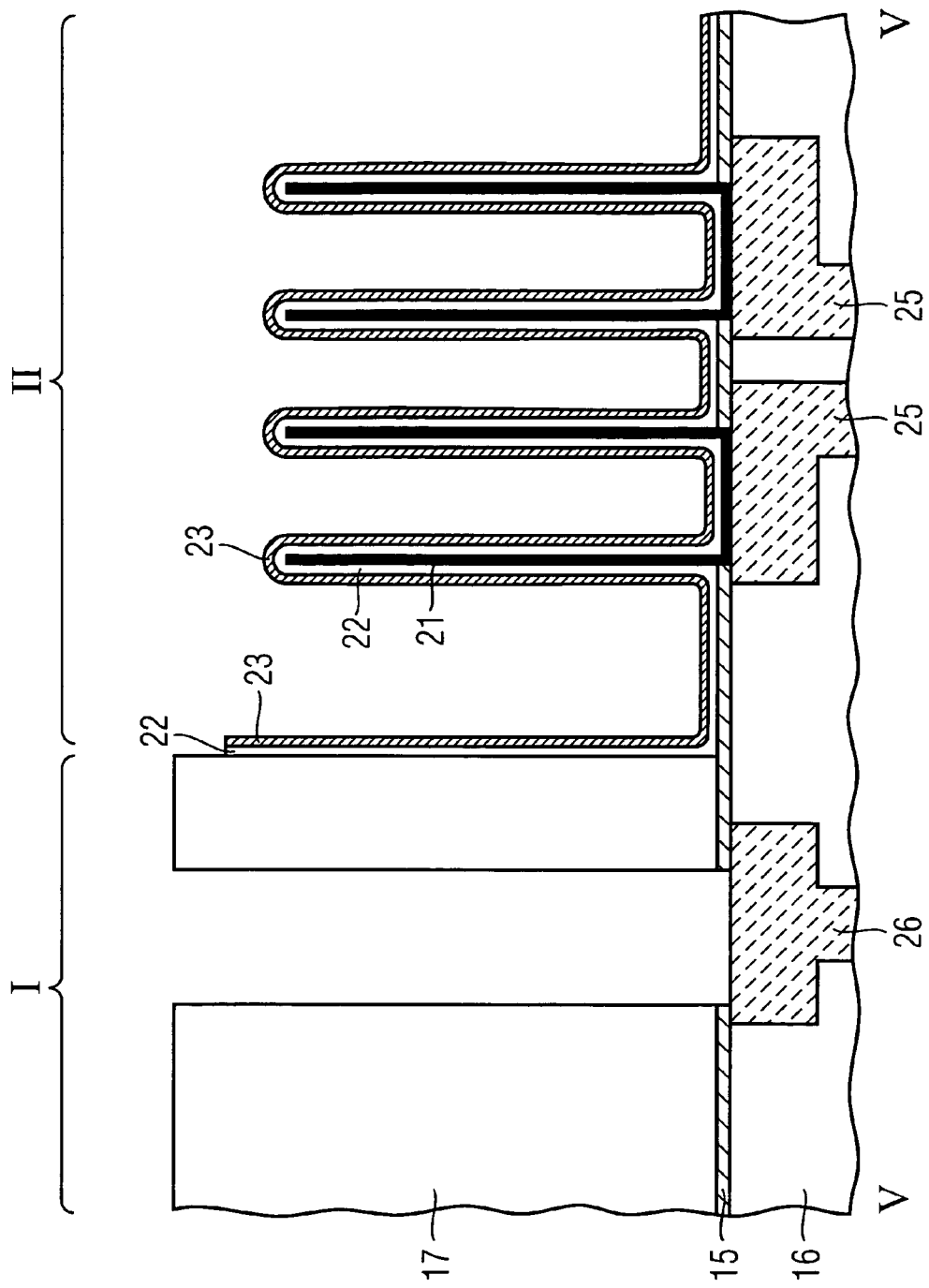
Figure 20:
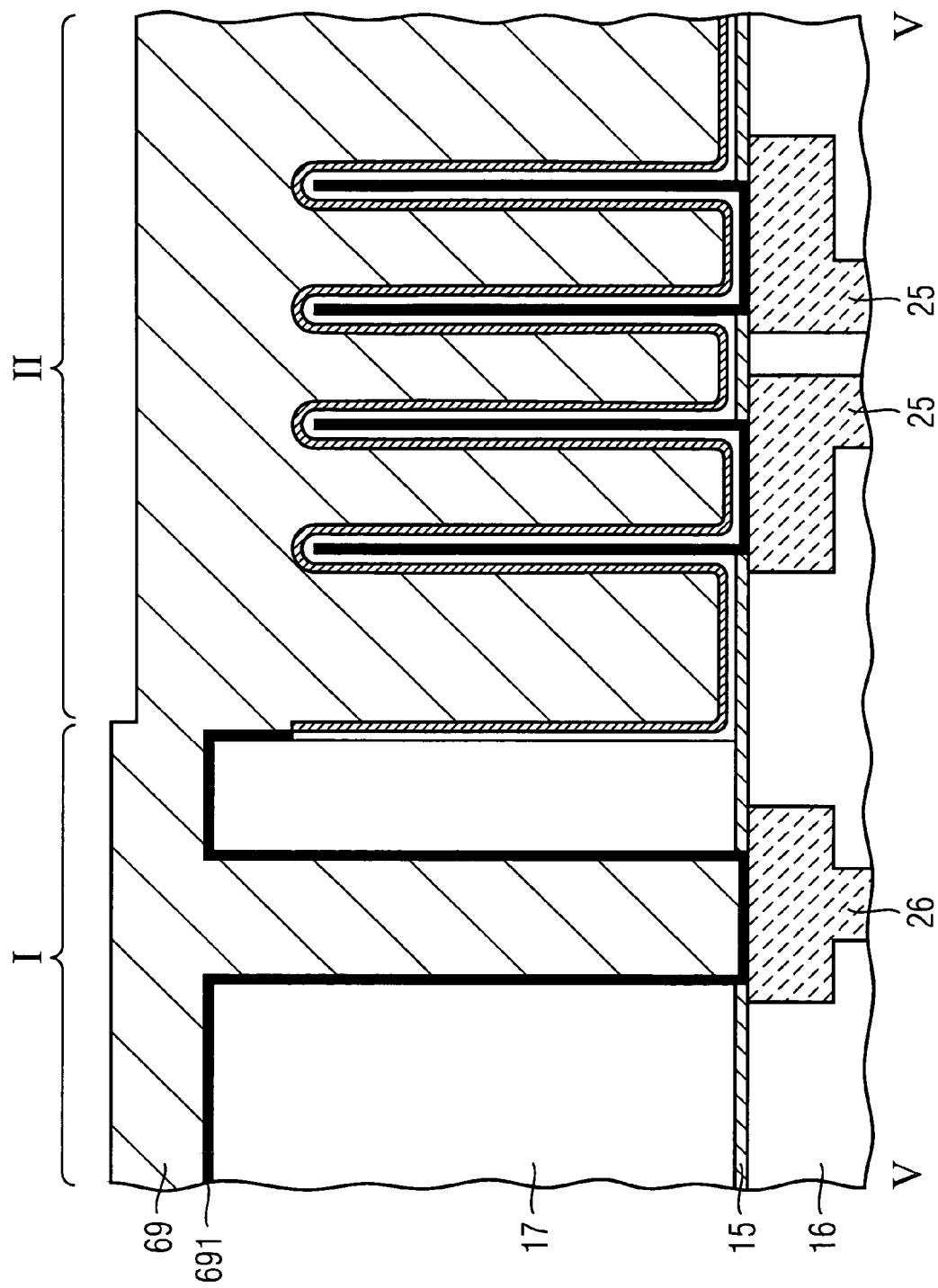

Then, the silicon dioxide layer 64 is removed from the opening 61. If the block mask is made of silicon dioxide, the block mask 68 is simultaneously removed by this etching step. In addition, the TiN liner 63 is removed from the peripheral portion, leaving the silicon dioxide layer 17 uncovered in the peripheral portion. If the block mask 68 is made of resist, it is removed thereafter from the array portion II. The resulting structure is illustrated in FIG. 19. In the next step, a thin TiN liner 691 having a thickness of approximately 5 nm is provided. In particular, the liner 691 is thinner than the liner 63. In more detail, the thickness of the liner 63 is determined in terms of the stability of the stacked capacitor to be formed. Nevertheless, the liner 691 for forming a C1 contact in the peripheral portion should be thinner than the TiN liner 63 for forming the capacitor electrode. The TiN liner 691 is deposited by using an ALD (Atomic Layer Deposition) method. Thereafter, a tungsten layer 69 is deposited on the resulting surface by a CVD (chemical vapour deposition) process. The resulting structure is illustrated in FIG. 20.

Figure 21:
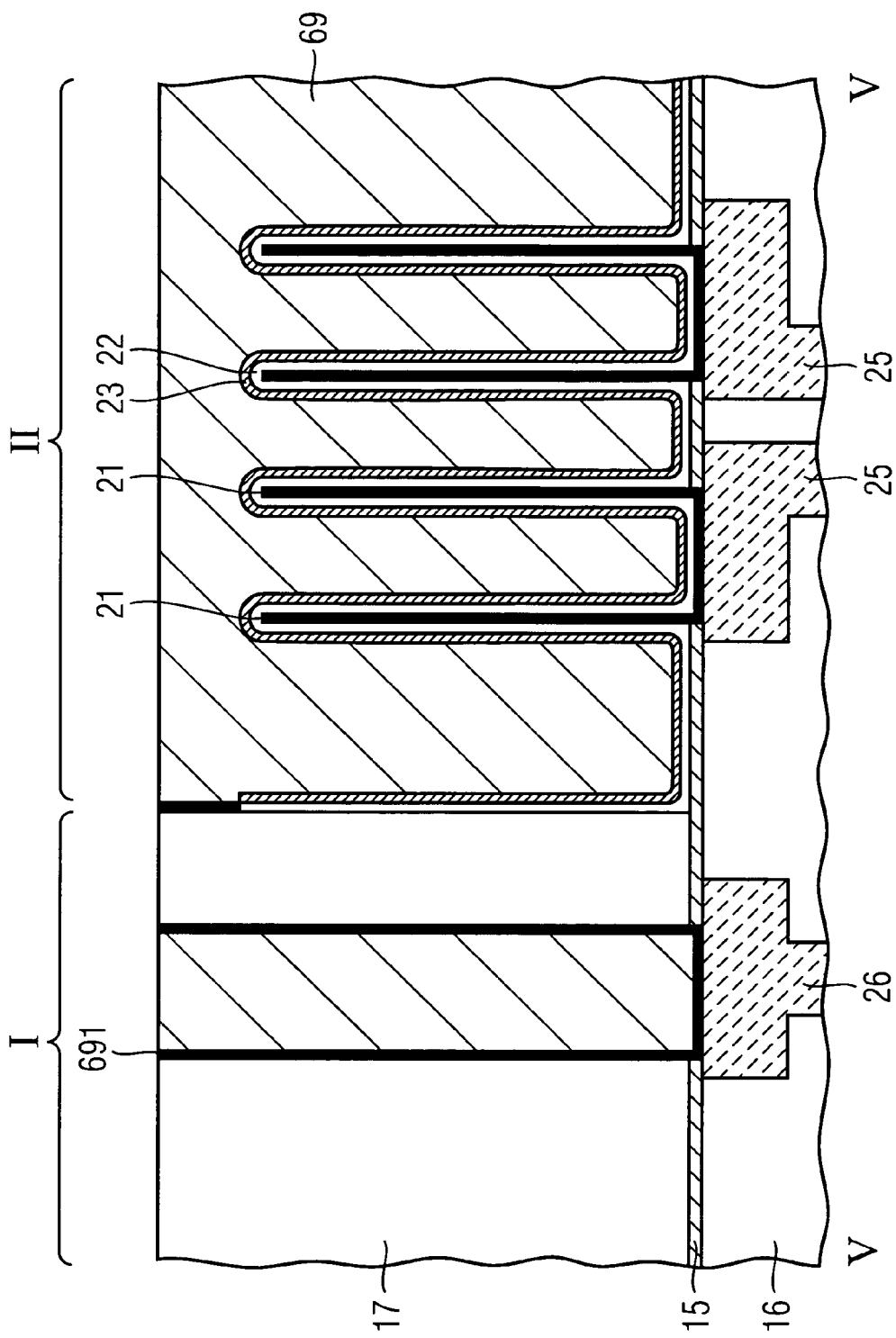

In the next step, a CMP step is performed so as to remove the excessive tungsten material as well as the horizontal portions of the TiN layer 691 in order to prevent shorts between adjacent C1 contacts. This is illustrated in FIG. 21.

Figure 22:
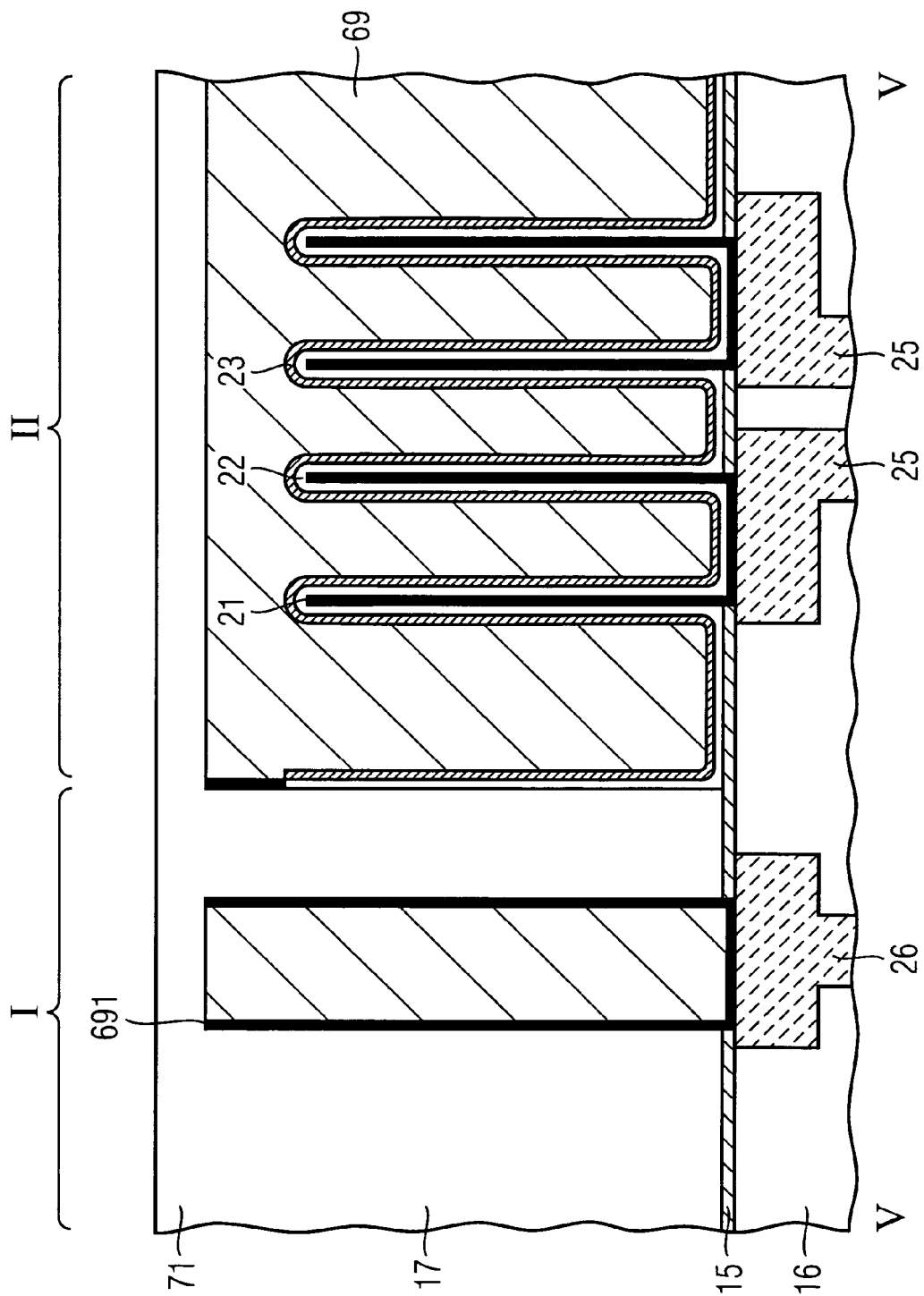

Then, a silicon dioxide layer 71 is deposited on the resulting structure as is illustrated in FIG. 22.

Figure 23:
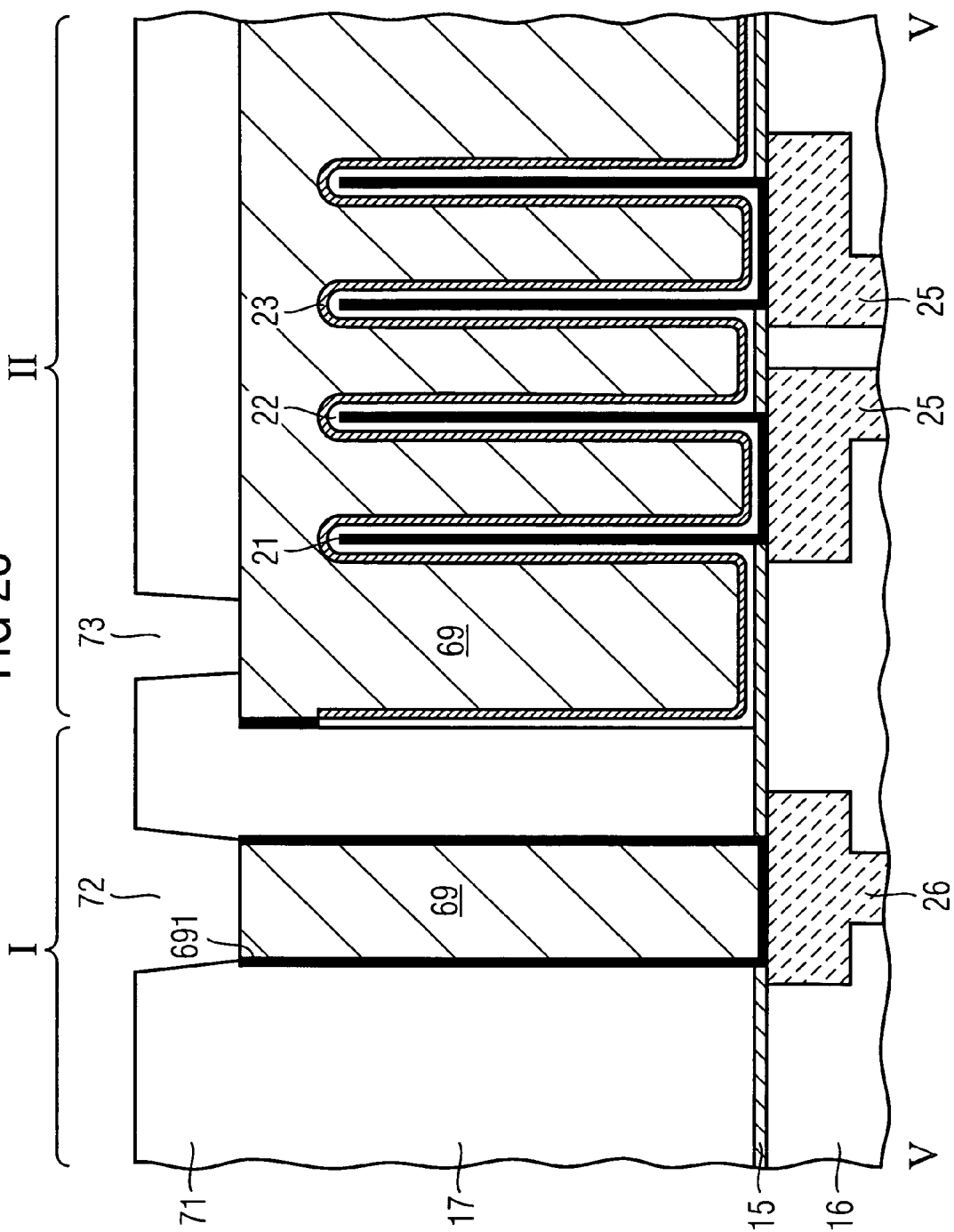
Figure 24:
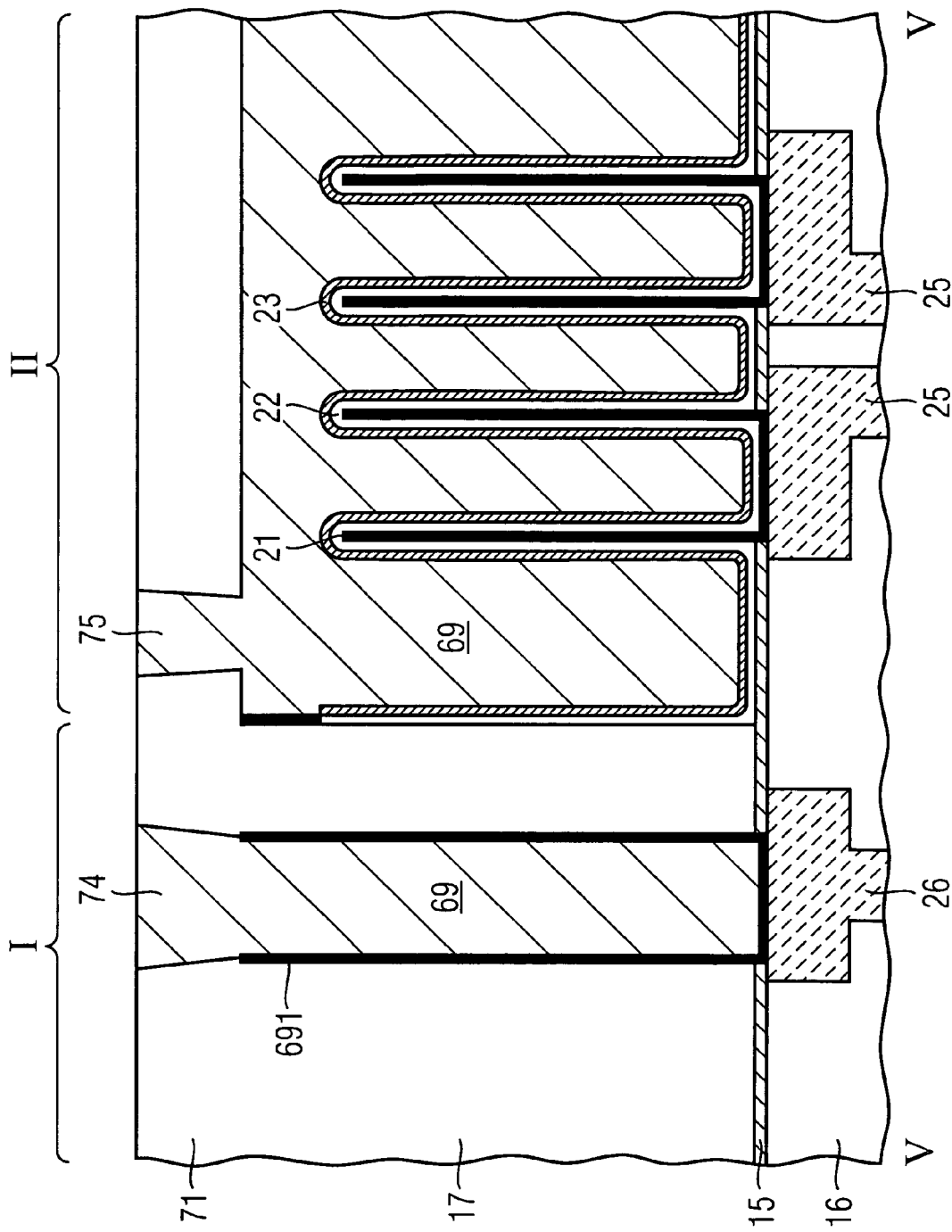

As is illustrated in FIG. 23, openings 72, 73 are formed in the silicon dioxide layer 71. In particular, the opening 72 serves as a C1 contact opening, whereas the opening 73 acts as a plate contact opening. In the next step, the C1 contact opening 72 and the plate contact opening 73 are filled with a conductive material, in particular, with tungsten so as to complete the C1 contact as well as the plate contact 75. Next, optionally, a CMP step is performed so as to obtain a planarized surface. The resulting structure is illustrated in FIG. 24. As can be taken from FIG. 24, the C1 contact which is connected with the peripheral contact pad 26, having an upper portion 74 forming the C1 contact plug as well as lower portion. In the lower portion, a TiN liner is provided at the side walls of the contact whereas in the upper portion, in particular, in the C1 contact plug 74 TiN liner is not necessarily provided.

In addition, the counter electrodes of the storage capacitors of the array portion II are connected with the plate contact 75 which is formed at the upper portion of the resulting structure.

Figure 25:
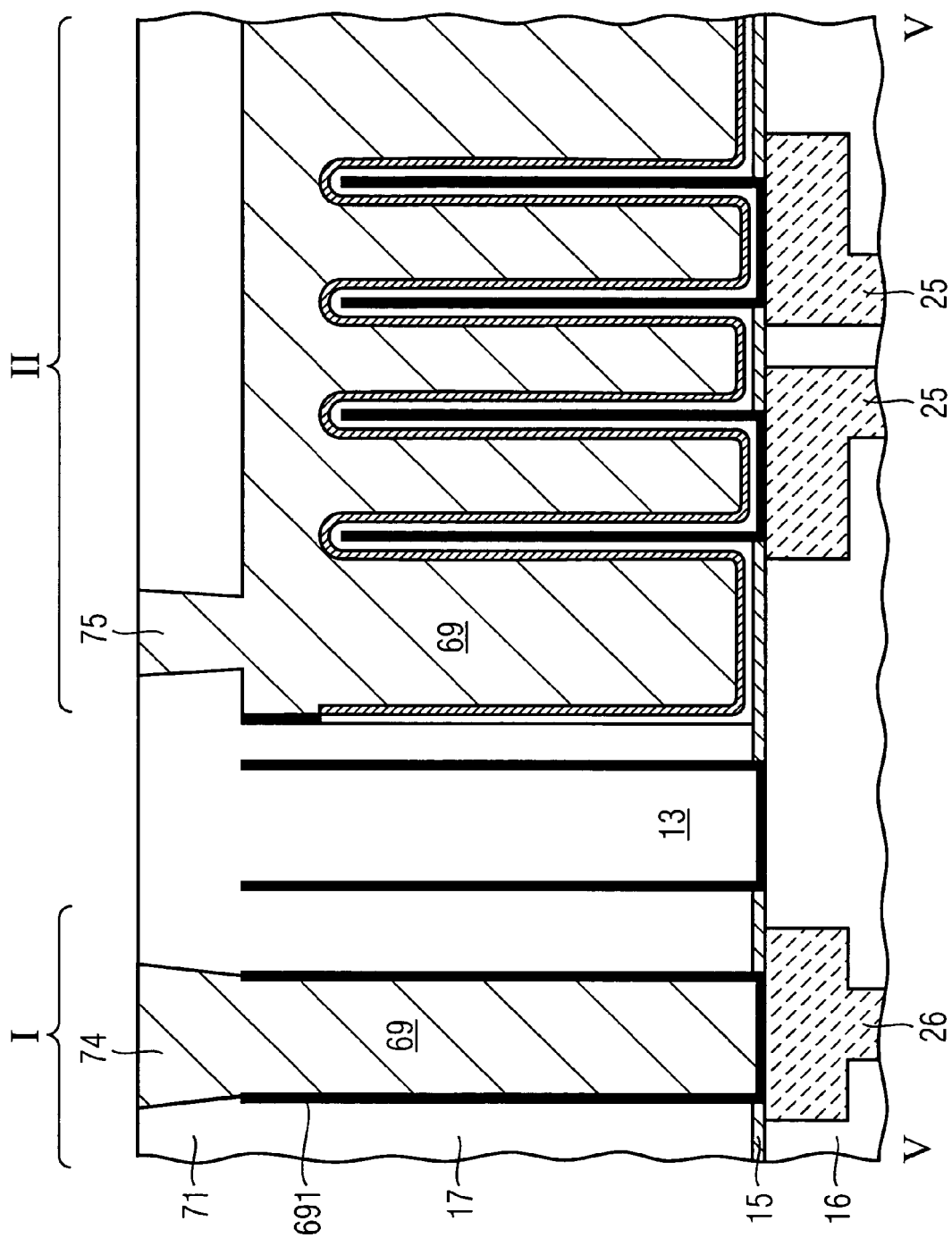
FIG. 25 illustrates a cross-sectional view of a memory device according to one embodiment of the present invention.

FIG. 25 illustrates a cross sectional view of the array portion II comprising the completed stacked capacitor and the peripheral portion I, including the C1 contact, with an array separation trench 13 being present between the array portion I and the array portion II. The array separation trench 13 serves as a lateral etch stop when etching the silicon dioxide material 17 in the array portion selectively with respect to the peripheral portion in the step which has been described with reference to FIG. 14.

Figure 26:
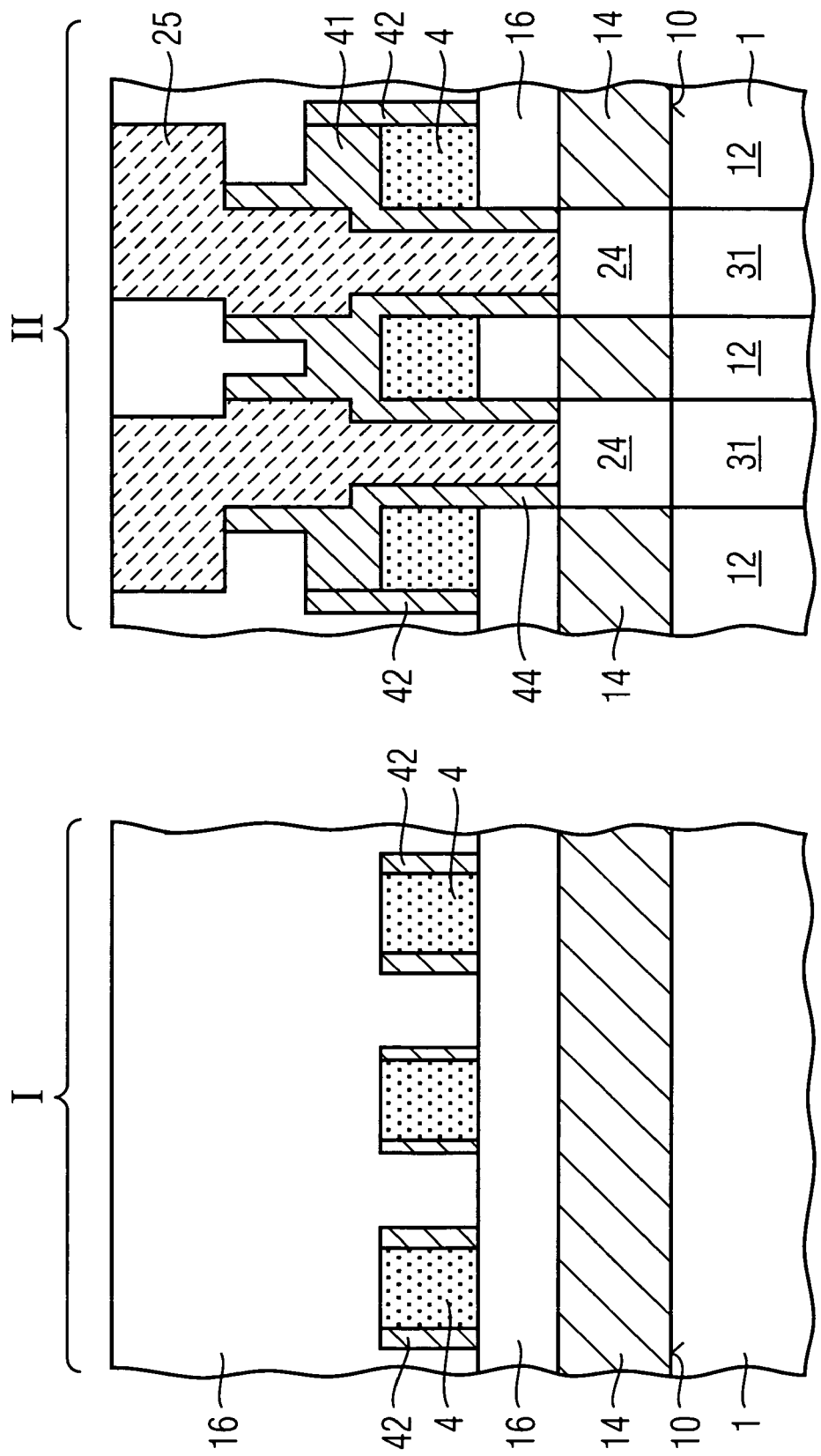
FIG. 26 illustrates a further embodiment of the present invention.

As an alternative, the method of the present invention can be implemented, starting from the structure illustrated in FIG. 26. As can be seen, the array portion II is identical with the array portion II as illustrated in FIG. 7. Nevertheless, in contrast to the structure illustrated in FIG. 7, in the peripheral portion, the M0 wiring layer 4 is present, with no peripheral contact pad 26 being provided. Differently speaking, the peripheral contact pad 26 from FIG. 7 can as well be omitted. In this case, the etching step, which is described with reference to FIG. 10, for example, has to be performed so as to stop on the $Si_3N_4$ layer 15. In particular, the etching step for etching the openings 62 and 61 must be an etching step which is selective to $Si_3N_4$. After a breakthrough etch through the $Si_3N_4$ layer 15, an etching step which etches $SiO_2$ selectively with respect to the material of the M0 wiring layer and the material of the landing pads 25, the openings 61 can be formed so as to be in contact with the M0 wiring layer 4. If no peripheral contact pads are provided, it is important to choose the width and the material of the contact pads 25 adequately to meet the overlay requirement in order to ensure that the openings 62 are completely in contact with the array contact pads 25. Thereafter, the same process steps which have been described before will be performed.

Figure 27:
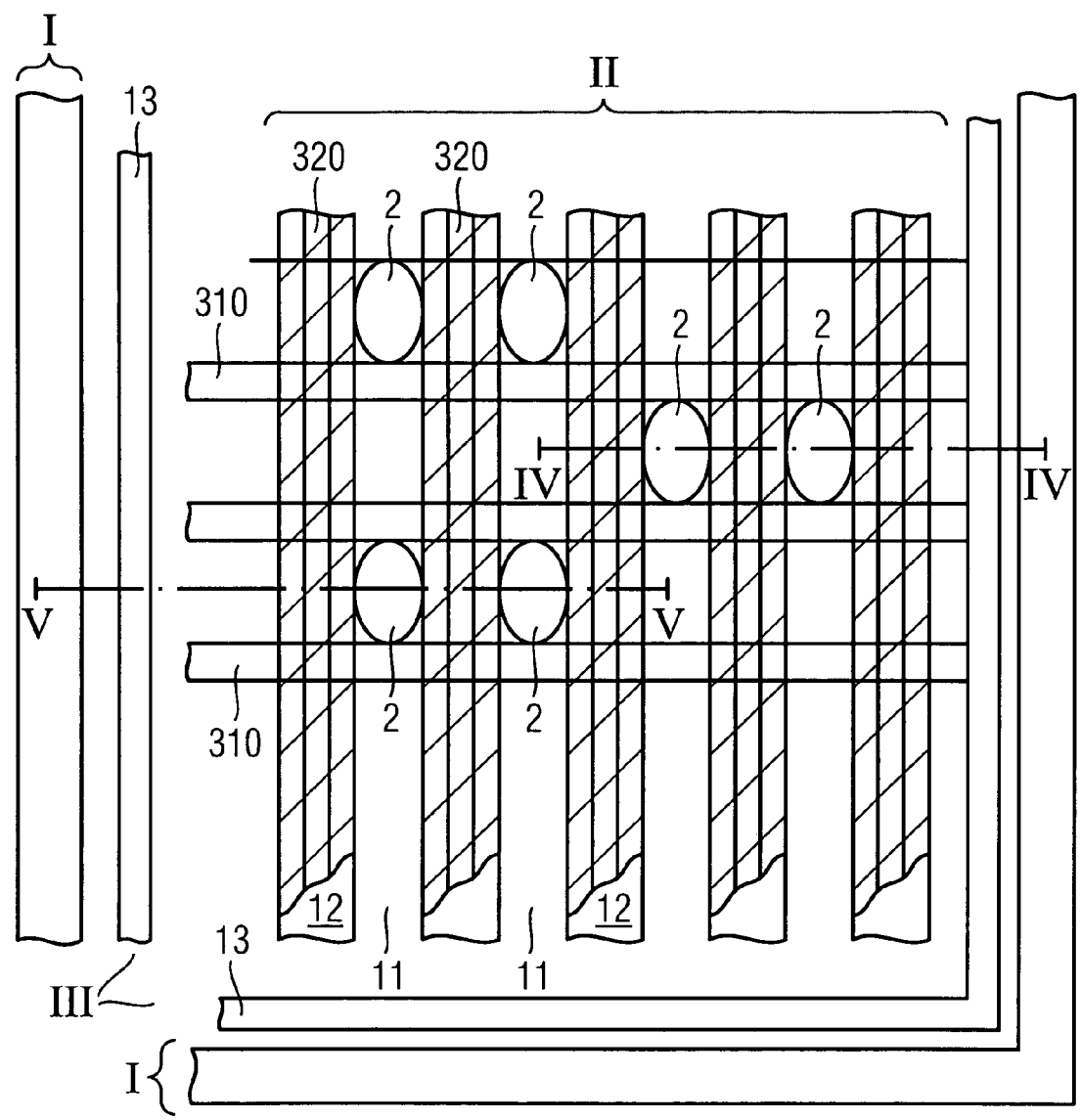
FIG. 27 illustrates a plan view on the memory cell array including the boundary region which can be manufactured by the method of one embodiment of the present invention.
Figure 28:
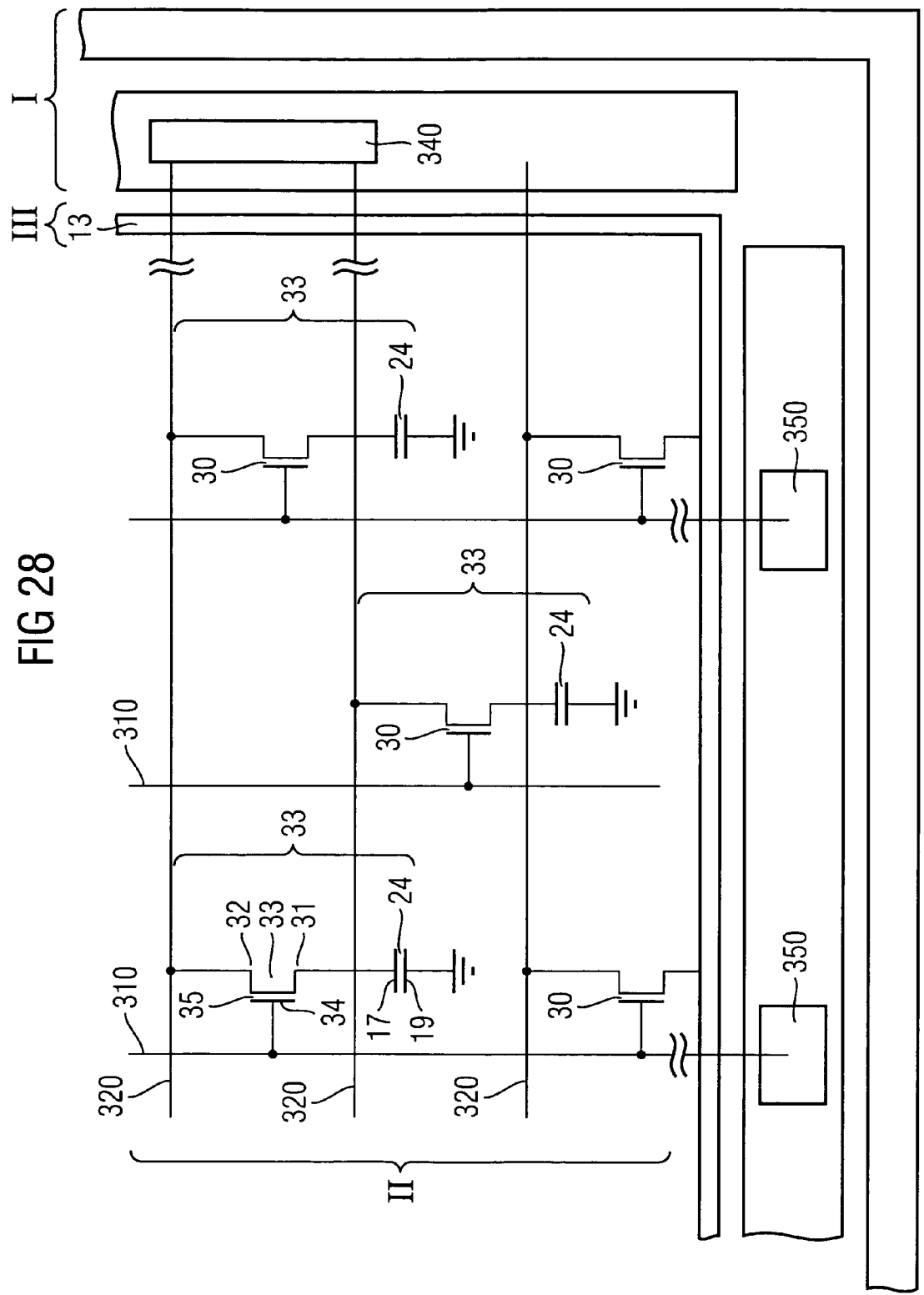
FIG. 28 illustrates a schematic view of the memory device of the present invention.

FIG. 27 illustrates an exemplary layout of the resulting memory cell array. As can be seen, an array portion II is provided, as well as a peripheral portion I. An array separation trench 13 is provided at a boundary region between the support portion I and the array portion II. In the array portion II, bitlines 320 are arranged in a first direction, perpendicularly intersecting word lines 310. In the illustrated layout, the bitlines 320 are arranged above the isolation trenches 12, which laterally delimit the active areas 11. Storage capacitors are formed in pairs so that two storage capacitor are adjacent to each other respectively.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming an integrated circuit comprising a plurality of storage capacitors, the method comprising:
   providing a sacrificial layer covering a substrate surface of a semiconductor substrate;
   defining openings in the sacrificial layer, each opening exposing an array contact pad formed in an array portion of the semiconductor substrate;
   defining peripheral contact openings in the sacrificial layer, each peripheral contact opening exposing a part of a peripheral circuitry formed in a peripheral portion of the semiconductor substrate;
   thereafter providing a storage electrode of a first conductive material in each of the openings in the array portion so that each storage electrode is in contact with one of the array contact pads;
   masking the peripheral portion with a layer of a second masking material which is different from a material of the sacrificial layer;
   removing the sacrificial layer from the array portion while maintaining the sacrificial layer in the peripheral portion;
   providing a storage dielectric on each storage electrode;
   thereafter removing the second masking material; and
   thereafter providing a counter electrode on each storage dielectric in the array portion thereby completing the plurality of storage capacitors and a second conductive material in the peripheral contact openings so as to complete a plurality of peripheral contacts.

2. The method of claim 1, wherein
   the openings and the peripheral contact openings are formed simultaneously by one step of etching the sacrificial layer.

3. The method of claim 1, further comprising:
   defining an array separation trench in the sacrificial layer at a boundary region separating the array portion and the peripheral portion; and
   filling the array separation trench at least partially with a first masking material which is different from the material of the sacrificial layer.

4. The method of claim 1, wherein providing the storage electrodes comprises;
   depositing a conductive liner layer on a surface of the sacrificial layer and a surface of the openings and a surface of the peripheral contact openings after defining the openings and the peripheral contact openings.

5. The method of claim 4, further comprising
   depositing a further sacrificial layer in the peripheral contact openings after depositing the conductive liner layer.

6. The method of claim 1, further comprising
   providing a plurality of peripheral contact pads connected with at least part of the peripheral circuitry, wherein each of the peripheral contact openings is in contact with one of the peripheral contact pads.

7. The method of claim 1, wherein the second conductive material in the peripheral contact openings comprises tungsten.

8. The method of claim 4, further comprising removing the conductive liner layer from the peripheral contact openings.

* * * * *